(12) United States Patent
Matsui

(10) Patent No.: US 7,629,606 B2
(45) Date of Patent: Dec. 8, 2009

(54) FUNCTIONAL MOLECULAR ELEMENT, METHOD FOR PRODUCING FUNCTIONAL MOLECULAR ELEMENT, AND FUNCTIONAL MOLECULAR DEVICE

(75) Inventor: Eriko Matsui, Kanagawa (JP)

(73) Assignee: Sony Corporation, Tokyo (JP)

( * ) Notice: Subject to any disclaimer, the term of this patent is extended or adjusted under 35 U.S.C. 154(b) by 476 days.

(21) Appl. No.: 11/422,485

(22) Filed: Jun. 6, 2006

(65) Prior Publication Data

US 2006/0278868 A1    Dec. 14, 2006

(30) Foreign Application Priority Data

Jun. 13, 2005    (JP) .............................. 2005-172629

(51) Int. Cl.
*H01L 51/30* (2006.01)
*C07D 487/22* (2006.01)

(52) U.S. Cl. .......... 257/40; 257/E51.023; 257/E51.041; 257/E51.044; 540/145; 977/791

(58) Field of Classification Search .................. 257/40, 257/E51.001–E51.052; 438/82, 99; 540/145; 977/791

See application file for complete search history.

(56) References Cited

U.S. PATENT DOCUMENTS

| 6,128,214 | A | 10/2000 | Kuekes et al. |
| 6,256,767 | B1 | 7/2001 | Kuekes et al. |
| 6,723,394 | B1 * | 4/2004 | Sirringhaus et al. .......... 428/1.1 |

FOREIGN PATENT DOCUMENTS

WO    WO 03023506 A2 *    3/2003

OTHER PUBLICATIONS

Tang, Q., et al. ADV. Mater., vol. 18 (2006): pp. 65-68.*
van de Craats, A.M., et al. ADV. Mater., vol. 15(2003): pp. 495-499.*
Cavaleiro, J.A.S., et al. Tetra. Lett., vol. 33, No. 45 (1992): pp. 6871-6874.*
Yamauchi, T., et al. Chem. Comm. (2005): pp. 1309-1311.*

(Continued)

*Primary Examiner*—Douglas M Menz
*Assistant Examiner*—Matthew W Such
(74) *Attorney, Agent, or Firm*—K&L Gates LLP

(57) ABSTRACT

A functional molecular element with a reduced contact resistance between the constituting molecule and the electrode, a method for production thereof, and a functional molecular device are provided herein. The method consists of the following steps. A closely adhering molecular monolayer is formed on the surface of the electrodes from a π-electron conjugated molecule (one species of linear tetrapyrrole) composed of the porphyrin-like nearly discoid skeleton and the flexible side chains (alkyl chains). A π-electron conjugated molecule of the same species as the one or different species from the one is piled on the monolayer by π-π stacking to form the array structure. As the result of the foregoing steps, the π-electron conjugated molecule constituting the first molecular layer of the array structure takes on such a configuration that the flexible side chains adsorb to the surface of the electrode and the discoid skeleton orients parallel to and adheres to the surface of the electrode. The second and subsequent molecular layers constituting the array structure have their piling direction controlled by the π-π mutual action.

14 Claims, 18 Drawing Sheets

OTHER PUBLICATIONS

Szterenberg, L., et al. CHEMPHYSCHEM, vol. 4 (2003): pp. 691-698.*

Struckmeier, G., et al. J. Am. Chem. Soc., vol. 98 (1976): pp. 278-279.*

Mizutani, T., et al. J. Am. Chem. Soc., vol. 118 (1996): pp. 5318-5319.*

Latos-Grazynski, L., et al. Inorg. Chem., vol. 37 (1998): pp. 4493-4499.*

Johnson, J.A., et al. Inorg. Chem., vol. 38 (1999): pp. 5379-5383.*

Cherian, S., et al. J. Appl. Phys., vol. 96 (2004): pp. 5638-5643.*

Simpson, C.D., et al. "From Graphite Molecules to Columnar Superstructures—An Exercise In Nanoscience." J. Mater. Chem., vol. 14 (2004): pp. 494-504.*

J. Alben et al., "Infrared Spectroscopy of Porphyrins," Annals New York Academy of Sciences, vol. 206, pp. 278-295, 1973.

J. Chen et al., "Large on-off ratios and negative differential resistance in a molecular electronic device", Science, vol. 286, pp. 1550-1551, Nov. 1999.

M. A. Reed et al., "Conductance of a Molecular Junction," Science, vol. 278, pp. 252-253, Oct. 1997.

L. Scudiero et al., "Physical Properties and Metal Ion Specific Scanning Tunneling Microscopy Images of Metal (II) Tetraphenylporphyrins Deposited from Vapor onto Gold (111)," Journal of Physical Chemistry, vol. 104, pp. 11899-11905, 2000.

L. Scudiero et al., "Scanning Tunneling Microscopy, Orbital-Mediated Tunneling Spectroscopy, and Ultraviolet Photoelectron Spectroscopy of Nickel (II) Octaethylporphyrin Deposited from Vapor," Journal of Physical Chemistry, vol. 106, pp. 996-1003, 2002.

Y. Shimizu et al.,"Photoconduction of a mesogenic long-chain tetraphenylporphyrin in a symmetrical sandwhich-type cell," Thin Solid Films, vol. 331, pp. 279-384, 1998.

R. G. Snyder et al., "C-H Stretching Modes and the Structure of n-Alkyl Chains. 1. Long, Disordered Chains," Journal of Physical Chemistry, vol. 86, pp. 5145-5150, 1982.

S. T. Trzaska et al., "Cooperative chirality in Columnar Liquid Crystals: Studies of Fluxional Octahedral Metallomesogens," Journal of the American Chemical Society, vol. 121, pp. 4518-4519, 1999.

J. M. Wessels et al., "Optical and Electrical Properties of Three-Dimensional Interlinked Gold Nanoparticle Assemblies," Journal of the American Chemical Society, vol. 126, pp. 3349-3356, 2004.

M. Yamamoto et al., "Structures of a Long-Chain n-Alkane, n-C44H90, on a Au(111) Surface: An Infrared Reflection Absorption Spectroscopic Study," Journal of Physical Chemistry, vol. 104, pp. 7363-7369, 2000.

Feringa, Ben L., Molecular Switches,Wiley-VCH GmbH, 2001.

Y. Shimizu, "Photoconductivity of Discotic Liquid Crystal" Molecular Crystal and Liquid Crystal, 370 p. 83-91 (2001).

Y. Shimizu, "Columnar Liquid Crystal and Its Versatile Molecular Structure and Intramolecular Mutual Action" Liquid Crystal, 6 p. 147-159 (2002).

* cited by examiner

○ CARBON ATOM   ⦿ NITROGEN ATOM   ● OXYGEN ATOM   ◎ METAL ION edge-on face-on

GOLD ELECTRODE edge-on face-on

45°

REFERENCE SURFACE

FUNCTIONAL MOLECULAR ELEMENT, METHOD FOR PRODUCING FUNCTIONAL MOLECULAR ELEMENT, AND FUNCTIONAL MOLECULAR DEVICE

CROSS REFERENCES TO RELATED APPLICATIONS

The present application claims priority to Japanese Patent Application JP 2005-172629 filed in the Japanese Patent Office on Jun. 13, 2005, the entire contents of which being incorporated herein by reference.

BACKGROUND

The present application relates to a new functional molecular element that changes in conductivity under the influence of electric field, a method for production thereof, and a functional molecular device.

There has recently emerged a new technology called nanotechnology to observe, produce, and utilize microstructure of the order of $10^{-8}$ m $=10$ nm.

The scanning tunneling microscope, which is an extremely high-accuracy microscope invented in the late 1980's, has made it possible to observe as well as manipulate atoms and molecules individually.

In fact, writing letters with atoms arranged on the crystal surface has been reported. Despite such capability, it is not practical to create a new material or to assemble a new device by manipulating an immense number of atoms and molecules individually.

Making an extremely small structure on the order of nanometers by manipulating atoms or molecules or groups thereof individually requires a new technology for ultraprecision fabrication. There are two systems suitable for microprocessing with accuracy of the order of nanometers.

One is so-called top-down system which has been used to fabricate various semiconductor devices in related art. It is exemplified by fabrication of integrated circuits from silicon wafers by extremely accurate etching to the very limits. The other is so-called bottom-up system, which is designed to assemble a desired nanostructure from atoms and molecules as extremely small constituents.

The limit of size of nanostructure that could be achieved by the top-down system is suggested by Moore's law (proposed in 1965 by Gordon Moore as a co-founder of Intel Corporation) which stipulates that the number of transistors on a chip will be doubling every 18 months. In fact, the rate of integration of transistors has increased over the past 30 years from 1965 as predicted by Moore's law.

It is considered that Moore's law will continue to be effective according to the International Technology Roadmap for Semiconductor (ITRS) 2005 Edition for coming 15 years which was published by the Semiconductor Industry Association (SIA).

The ITRS consists of a near-term roadmap up to 2013 and a long-term roadmap up to 2020. The former predicts that in 2013 the DRAM half pitch will be 32 nm. The latter predicts that the DRAM half pitch will shrink to 14 nm in 2020.

As the degree of microfabrication increases further, resulting semiconductor chips run faster with less power consumption. Moreover, improved microfabrication yields more products from a single wafer, thereby reducing production cost. This is the reason why microprocessor makers compete in the process rule for new products and the degree of transistor integration.

In November 1999, a research group in the United States published an epoch-making result of research on the technology of microfabrication. This technology was developed by Prof. Chenming Hu and his team in charge of computer science in the University of California at Berkeley. Its object is to design the gate on a field effect transistor (FET) called FinFET. It makes it possible to form 400 times as many transistors as before on a single semiconductor chip.

The gate is an electrode to control the flow of electrons in the channel of an FET. According to the existing ordinary design, it is placed parallel to the surface of the semiconductor so that it controls the channel from one side. The disadvantage of this gate arrangement is that the gate cannot cut off the flow of electrons unless it is longer than prescribed. Therefore, the gate length has been considered to be one factor that restricts miniaturization of transistors.

By contrast, the FinFET has a fork-shaped gate which holds the channel between both sides for effective channel control. This structure permits further reduction of gate length and further miniaturization of transistors than the one in related art.

The above-mentioned research group produced a prototype FET having a gate length of 18 nm, which is one-tenth of the existing ordinary gate length. This achievement corresponds to the size predicted for the year 2014 in the long-term roadmap of ITRS. Prof. Chenming Hu and his team do not claim patent for their invention in hope that their new technology will be widely accepted in the semiconductor industry. There is the possibility of FinFET becoming the mainstream of the manufacturing technology.

On the other hand, experts predict that the time will soon come when Moore's law is no longer valid in the light of natural rule.

Since the current major technology for semiconductor chips involves lithography to form circuit patterns on silicon wafers, it is necessary to improve resolution for further miniaturization. To this end, it is necessary to develop a practical technology to employ light with a shorter wavelength.

Another problem involved in increasing the degree of integration is excessive heat evolution, which leads to malfunction and thermal breakage at high temperatures.

Moreover, there are some experts who predict that miniaturization of semiconductor chips that continues at the present pace will reach the stage in which equipment cost and process cost go up and yields go down. As the result, the semiconductor industry will not pay in around the year 2015.

Another problem which has been pointed out recently is line edge roughness (or minute irregularities around pattern edges). As to irregularities on the surface of a resist mask, it is said that the size of molecules constituting a resist and the distance of diffusion of acid in a chemically amplified photoresist become critical as the pattern size is reduced more than before. Another important problem is that the device characteristics depend on the cycle of irregularities on the pattern edge.

To resolve the above-mentioned bottleneck in the top-down system, a new technology is under development which makes individual molecules function as electronic parts and constructs electronic devices, such as molecular switches, from individual molecules by the bottom-up system.

Researches on the technology to make nanostructure from metal, ceramics, or semiconductor by the bottom-up system are also under way. It would be possible to design and create (molecular) devices entirely different from ones in related art if millions of species of diverse molecules independently varying in size and function are assembled by the bottom-up system.

Conductive molecules, each having a width of only 0.5 nm, which is by far smaller than the line width of about 100 nm achieved in the current IC technology, carry a potential for thousands times high-density wiring. Moreover, it would be possible to realize a recoding device with a capacity larger than 10,000 times that of DVD if individual molecules are used as memory elements.

Molecular devices are chemically synthesized unlike silicon semiconductor devices in related art. The world's first organic transistor of polythiophene (polymer) was developed in 1986 by Hiroshi Koezuka of Mitsubishi Electric Corporation.

Further, research groups in Hewlett-Packard Company and the University of California at Los Angeles developed organic electronic devices and published them in the July 1999 issue of Science and applied for patent. (See in U.S. Pat. No. 6,256,767B1 and U.S. Pat. No. 6,128,214). They also made switches from molecular film composed of millions of rotaxane molecules (which are organic molecules) and completed AND gates (as fundamental logic circuits) by joining them together.

Joint research groups in Rice University and Yale University in the US created a molecular switch which performs switching action as the molecular structure changes upon electron injection in an electric field. They published it in the November 1999 issue of Science. (See J. Chen, M. A. Reed, A. M. Rawlett and J. M. Tour. "Large on-off ratios and negative differential resistance in a molecular electronic device", Science, 1999, Vol. 286, 1552 to 1551) It has the repeating on-off function that was not achieved by the research groups in Hewlett-Packard Company and the University of California at Los Angeles. In addition, it has one millionth of the size of ordinary transistor, and this smallness will contribute to small high-performance computers.

Prof. J. Tour (of Rice University, chemistry) who succeeded in synthesis suggests that the cost of molecular switches would be only one thousandth of that of semiconductors in related art because expensive clean rooms are not necessary for their production. He is planning to construct a hybrid computer (composed of organic molecules and silicon) within five to ten years.

An organic thin-film transistor was completed from pentacene single crystals in Bell Labs (Lucent Technologies Inc.) in 1999.

The molecular devices with functions of electronic components which have been studied extensively so far are limited mostly to those which are driven by light, heat, protons, or ions (as described in "Molecular Switches" compiled by Ben L. Feringa, WILEY-VCH, Weinheim, 2001) and they merely include a few examples that are driven by electric field.

The above-mentioned problem of line edge roughness still remains in the molecular device, and it will become serious as the pattern is miniaturized further. One common way to avoid this problem in molecular devices is to introduce a thiol group into the terminal of the molecule for direct connection to a gold electrode. (See M. A. Reed, C. Zhou, C. J. Muller, T. P. Burgin and J. M. Tour, "Conductance of a molecular junction", Science, 1997, Vol. 278, 252 to 254) The molecular devices are superior in reproducibility to those of inorganic material because they are composed of minimum units smaller than roughness.

However, electrical connection between the thiol group and the gold electrode poses a problem with large electric resistance no matter whether the molecule itself has good electrical properties, and this prevents the molecular device from improving in its characteristic properties. (See J. M. Wessels, H. G. Nothofer, W. E. Ford, F. von Wrochem, F. Scholz, T. Vossmeyer, A. Schroedter, H. Weller and A. Yasuda, "Optical and electrical properties of three-dimensional interlinked gold nanoparticle assemblies", Journal of the American Chemical Society, 126(10), 3349 to 3356, Mar. 17, 2004)

Most of molecular elements in related art which are driven by electric field work in such a way that the constituent molecules under the influence of electric field change in their electronic state, which in turn changes conductivity between two (or more) electrodes. In the case of organic field effect transistor (organic FET), for example, the electric field that acts on organic molecules in the channel region changes the carrier movement in the organic molecules. The operating characteristics of the molecular element are greatly affected by the contact resistance between the constituent molecules and the electrode which is very large as mentioned above.

One of the present inventors has proposed a functional molecular element which works as a molecular switch to turn on and off electric current as the molecular structure changes under the influence of electric field. However, it is apparent that even the functional molecular element based on such a new principle cannot escape its operating characteristics being affected by the large contact resistance between the constituent molecules and the electrode.

Minimizing contact resistance between the organic molecules and the electrode is necessary even in the case where a molecular layer to flow electrons is interposed between opposing electrodes, as in solar cells.

Therefore it is desirable to provide a functional molecular element with a new construction which reduces contact resistance between the constituent molecules and the electrode, and a method for production thereof, and a functional molecular device.

SUMMARY

According to an embodiment, there is provided a functional molecular element which includes electrodes and π-electron conjugated molecules held between the electrodes, wherein each of the π-electron conjugated molecules has a plane (or nearly plane) skeleton and side chains connecting to the plane skeleton and also forms an adsorbing molecule, with the plane skeleton orienting approximately parallel to the electrodes, as the side chains adsorb to the electrodes, such that the structure consisting of the electrodes and at least the adsorbing molecules allows current to flow in the direction perpendicular to the plane skeleton.

According to an embodiment, there is also provided a method for producing the functional molecular element defined above, the method including a steps of preparing a solution containing the π-electron conjugated molecule in an adequate concentration; bringing the solution into contact with the electrodes; and evaporating solvent from the solution, thereby forming as many molecular layers of the π-electron conjugated molecule as proportional to the concentration.

According to an embodiment, there is also provided a functional molecular device in which the structure constituting the functional molecular element has opposing electrodes as the electrodes.

According to an embodiment, the functional molecular element is formed from π-electron conjugated molecules, each of which has a plane (or nearly plane) skeleton and side chains connecting thereto, and the side chains adsorb to the electrodes such that the plane skeleton orients approximately parallel to the electrodes. Therefore, the π-electron conjugated molecules closely adhere to the electrodes, allowing smooth exchange of -electrons between the π-electron conjugated molecules and the electrodes.

Thus, the functional molecular element according to an embodiment has a reduced contact resistance between the adsorbing molecule and the electrode, and the structure consisting of the electrodes and as least the adsorbing molecules permits current to flow efficiently in the direction perpendicular to the plane (or nearly plane) skeleton. Incidentally, the skeleton may be held between two electrodes or between one electrode and another 7c-electron conjugated molecule constituting a conductive body together with the adsorbing molecule.

According to an embodiment, the method for producing the functional molecular element includes a steps of preparing a solution containing the π-electron conjugated molecule in an adequate concentration; bringing the solution into contact with the electrodes; and evaporating solvent from the solution, thereby forming as many molecular layers of the π-electron conjugated molecule as proportional to the concentration. Therefore, this method gives the functional molecular element which has as many molecular layers of the π-electron conjugated molecule as necessary on the adsorbing molecule.

According to an embodiment, the functional molecular device is characterized in that the structure constituting the molecular element has opposing electrodes as the electrodes. This leads to a reduced contact resistance between the electrodes and the adsorbing molecule, and hence the functional molecular element permits current to flow efficiently across the electrodes in the direction perpendicular to the plane (or nearly plane) skeleton of the adsorbing molecules.

The above and other objects, features, and advantages of the present invention will become apparent from the following description when taken in conjunction with the accompanying drawings which illustrate preferred embodiments of the present invention by way of example.

BRIEF DESCRIPTION OF THE FIGURES

FIG. 7A is a schematic diagram showing the structure of the π-electron conjugated molecule 7 adsorbing to the electrode surface with its edge on, FIG. 7B is a schematic diagram showing the structure of the π-electron conjugated molecule 7 adsorbing to the electrode surface with its face on, and FIG. 7C is a schematic diagram showing the structure of the π-electron conjugated molecule 7 adsorbing to the electrode surface with its edge on and face on;

FIG. 9A is a side and a perspective views showing the orientation in flat-on all-trans configuration, and FIG. 9B is a side and a perspective views showing the orientation in gauche configuration according to Example 1;

DETAILED DESCRIPTION

Figure 1A:
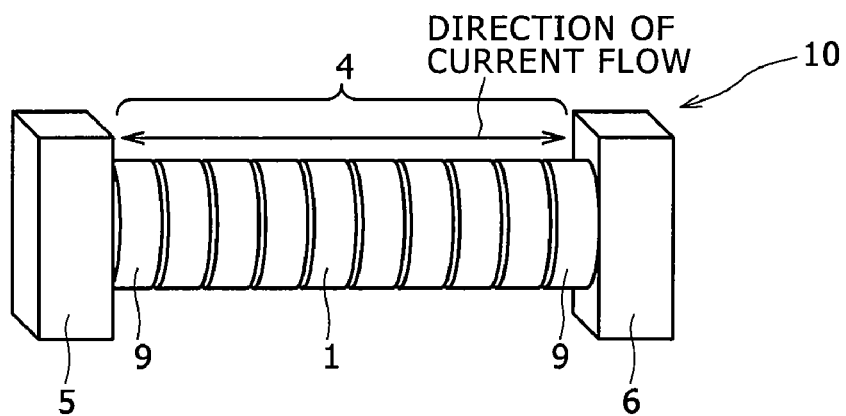
FIG. 1A is a schematic diagram showing the functional molecular element 10 according to a first embodiment.

According to an embodiment, the functional molecular element has the above-mentioned structure in which the π-electron conjugated molecules of the same species and/or different species are stacked up in one direction through the intramolecular π-π stacking in the skeleton of the adsorbing molecule. This array structure permits current to flow in the direction of layer stacking. The intramolecular π-π stacking in the array structure allows efficient current flow in the direction of layer stacking owing to the mutual action of π-electrons.

It is desirable that the columnar array structure be formed by intramolecular π-π stacking between the opposing electrodes from the adsorbing molecule and the π-electron conjugated molecules of the same species and/or different species and that the adsorbing molecule exist on either of the opposing electrodes.

The functional molecular element should preferably be constructed from π-electron conjugated molecules such that the skeleton described above and π-electron conjugated skeletons of the same species and/or different species are connected to each other through linkage chains. The structure should preferably be constructed such that the skeletons are arranged approximately parallel to the electrodes through the adsorption by the side chains, thereby forming the adsorbed skeleton. In addition, the π-electron conjugated skeletons of the same species and/or different species constitute the array structure in which they are stacked up in one direction with respect to the adsorbing skeleton, so that current flows in the direction of layer stacking in the array structure. The array structure formed from stacked skeletons permits current to flow efficiently in the direction of its layer stacking owing to the mutual actions of π-electrons.

It is desirable that the π-electron conjugated molecules form a columnar array structure between the opposing electrodes as the skeletons and the i-electron conjugated skeletons of the same species and/or different species are stacked up, and that the adsorbing skeleton exists on either of the opposing electrodes.

It is also desirable that the current be controlled by the gate field. In this case, the functional molecular element may be used as a sensor to detect the field or as a constituent of an insulated gate field effect transistor in which the conductivity of the structure is controlled by change in the gate field.

The π-electron conjugated molecule mentioned above should preferably have flexible side chains which are easy to adsorb to the electrodes.

The π-electron conjugated molecules of the same species and/or different species should preferably be tetrapyrrole derivatives, phthalocyanine derivative, or aromatic condensed polycyclic compounds having three or more rings. Preferred examples include porphyrin derivatives, linear tetrapyrrole derivatives, and coronene derivatives. Typical examples include biladienone derivatives, biliverdin derivatives, bilane derivatives, bilene derivatives, phlorin derivatives, and chlorin derivatives.

The porphyrin derivatives and linear tetrapyrrole derivatives should preferably be complexes having a central metal ion, particularly zinc ion. Such complexes form the array structure which greatly varies in conductivity (or exhibits the on-off switching performance) depending on the presence or absence of an electric field acting on it. Therefore, the array structure serves as the transistor. The central metal ion includes, in addition to zinc ion, copper ion and nickel ion (which are ions of typical elements and transition elements).

Desirable examples include those in which the above-mentioned side chain is any of alkyl group, alkoxyl group, and silanyl group or an aromatic ring having any of alkyl group, alkoxyl group, and silanyl group attached thereto.

The π-electron conjugated molecule mentioned above should preferably be at least a biladienone derivative represented by the general formula 1 below.

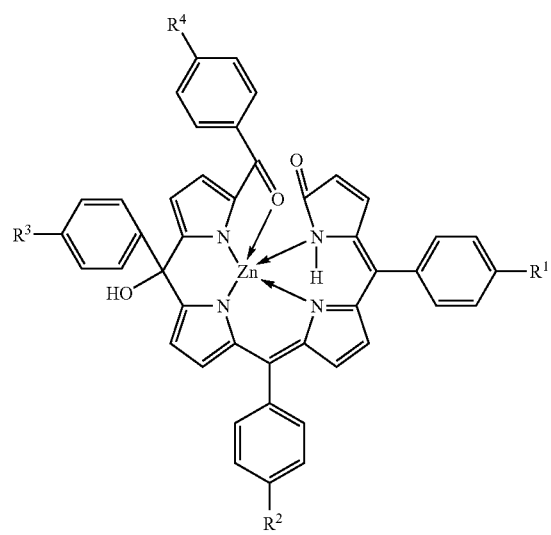

1

(where $R^1$, $R^2$, $R^3$, and $R^4$ independently denote identical or different C3-12 alkyl groups.)

$R^1$, $R^2$, $R^3$, and $R^4$ may be any groups having 3 to 12 carbon atoms, such as —$C_{10}H_2$, and —$C_{12}H_{25}$. Such side chains with 3 to 12 carbon atoms permit the π-electron conjugated molecule to orient in a good state and fix to the electrode without crystallization. In addition, such side chains are easy to synthesize. With C1 or C2 side chains, the π-electron conjugated molecule easily crystallizes to give a substance which lacks the properties inherent in liquid crystal and orients in an undesirable manner. In addition, side chains having 13 or more carbon atoms prevent orientation and present difficulties in synthesis.

According to an embodiment, the functional molecular element should preferably be prepared by coating with a solution of the π-electron conjugated molecule and a solution of the π-electron conjugated molecule of the same species and/or different species separately or simultaneously and subsequent solvent evaporation so that the layer of the π-electron conjugated molecule is covered with the layer of the π-electron conjugated molecule of the same species and/or different species. If necessary, it is possible to wash out with solvent extra layers from the thus formed layers of the π-electron conjugated molecule. The layer forming process should preferably be carried out such that the layer of the π-electron conjugated molecule of the same species and/or different species forms in a self-organizing manner on the layer of the π-electron conjugated molecule.

The step of solvent evaporation should preferably be followed by annealing at temperatures equal to or below 90° C. As explained in a first example later, annealing at this temperature causes more alkyl chains in side chains (which adsorb to the electrode) to take on the flat-on all-trans configuration. This in turn increases the ratio of the adsorbing molecules which have the plane (or nearly plane) skeleton arranged approximately parallel to the electrode.

According to an embodiment, the functional molecular device should preferably be constructed such that the array structure is electrically connected to each of the opposing electrodes. The π-electron conjugated molecule in the array structure is in close contact with the electrode because its side chains adsorb to the electrode in such a way that the plane (or nearly plane) skeletons orient approximately parallel to the electrode. This results in good contact between the electrode and the π-electrons of the π-electron conjugated molecule. This in turn leads to a reduced contact resistance between the electrode and the π-electron conjugated molecule.

In addition, the functional molecular device should preferably have an electrode to apply an electric field to the array structure for current control, the electrode extending in the direction of layer stacking in the array structure.

According to an embodiment, the functional molecular device should preferably be an insulated field effect transistor including a control electrode, a gate insulating layer formed on the control electrode, a source electrode and a drain electrode (both constituting opposing electrodes) formed on the gate insulating layer, and the array structure placed between the source electrode and the drain electrode.

The functional molecular element according to an embodiment is not limited to the active element mentioned above but it may include passive elements, such as resistance element and wiring element, used for resistance and wiring.

Embodiments will be described below in more detail with reference to the accompanying drawings.

FIRST EMBODIMENT

A first embodiment is concerned mostly with the functional molecular element corresponding to claims 1 to 3.

Figure 1B:
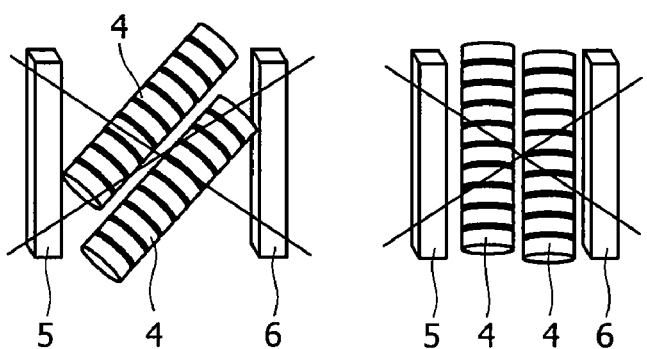
FIG. 1B is a schematic diagram showing a comparative example which is undesirable.
Figure 1C:
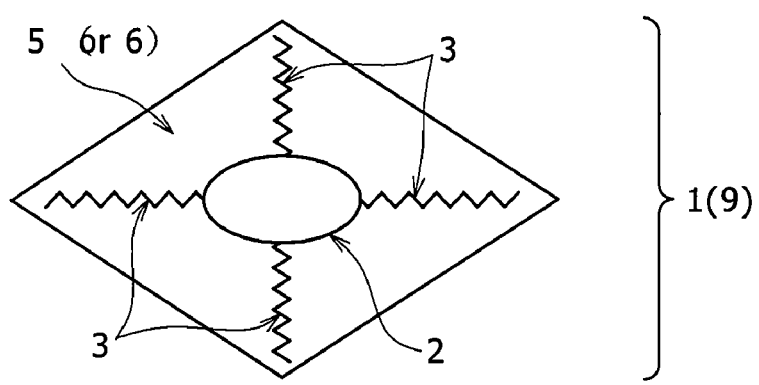
FIG. 1C is a schematic diagram showing the orientation of the π-electron conjugated molecule (adsorbed) in the first molecular layer of the array structure.
Figure 2:
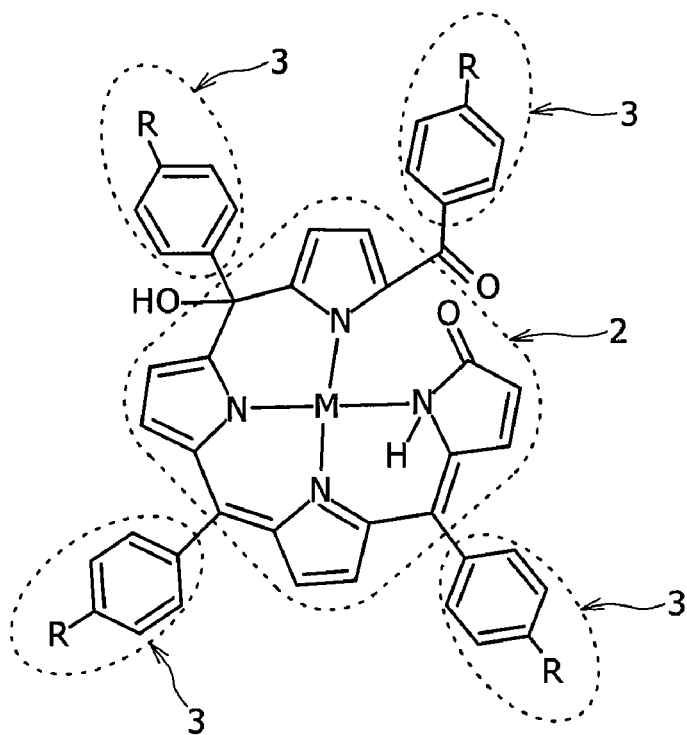
FIG. 2 is a structural formula of the π-electron conjugated molecule constituting the array structure according to the first embodiment.

FIG. 1A is a schematic diagram illustrating the functional molecular element 10 according to the first embodiment. FIG. 1B is a schematic diagram illustrating a comparative example. FIG. 1C is a schematic diagram illustrating the orientation of the π-electron conjugated molecule 1 (or the adsorbing molecule 9 on the electrode) in the first molecular layer of the array structure 4 constituting the functional molecular element 10. FIG. 2 is a structural formula of the π-electron conjugated molecule 1 constituting the array structure 4.

As shown in FIG. 2, a skeleton 2 of the π-electron conjugated molecule 1 is based on biladienone (or 4,9-biladien-1-one). Biladienone is one kind of linear tetrapyrrole whose structure corresponds to the open porphyrin ring. The π-electron conjugated molecule 1 is composed of the skeleton 2 and side chains 3 (p-alkylplhenyl groups) attached thereto. The skeleton 2 constitutes a porphyrin-like rigid, approximately plane discoid structure though the π-electron conjugated system. The side chain 3 constitutes a flexible chain structure on account of the intramolecular rotation around the C-C axis.

At the center of the porphyrin-like discoid structure is M which represents a metal ion such as zinc ion. This metal ion is not always necessary but is required for the functional molecular element to exhibit the switching characteristics as explained in a second example later.

FIG. 1A is a schematic diagram showing a model of the functional molecular element 10, which is composed of the π-electron conjugated molecule 1 having the nearly discoid plane skeleton 2 and a pair of electrodes 5 and 6 (of gold, for instance). The electrodes 5 and 6 hold between them the π-electron conjugated molecule 1 in such a way that the discoid skeleton orients parallel to the electrode surface, thereby forming the columnar array structure 4.

It is known that the array structure consisting of π-electron conjugated molecules each having a rigid discoid (or nearly discoid) skeleton like the π-electron conjugated molecule 1 is constructed such that the discoid (or nearly discoid) skeletons stack (in face-to-face mode) facing parallel to each other through the π-π electron mutual action, with π-electrons being delocalized among the stacked skeletons. Particularly, the π-electron conjugated molecules each having a long side chain of alkyl group with 6 or more carbon atoms (like discotic liquid crystal) stack in a columnar shape and exhibit high conductivity in the direction of stacking. (See Yo Shimizu, T. Higashiyama and T. Fuchita, "Photoconduction of a mesogenic long-chain tetraphenylporphyrin in a symmetrical sandwich-type cell", Thin Solid Films, 331 (1998), 279-284.)

It is reported that the metal ion may be placed near the center of the discoid (or nearly discoid) skeleton. (See Yo Shimizu, "Photoconductivity of Discotic Liquid Crystals: a Mesogenic Long-chain Tetraphenylporphyrin and Its Metal Complexes", Molecular Crystals and Liquid Crystals, 370 (2001), 83-91, S. T. Trzaska, H-F. Hsu and T. M. Swager, "Cooperative Chiralith in Columnar Liquid Crystals: Studies of Fluxional Octahedral Metallomesogen", J. Am. Chem. Soc., 121 (1999), 4518-4519, and Yo Shimizu, "Columnar Liquid Crystal and Its Versatile Molecular Structure and Intramolecular Mutual Action", Liquid Crystals, 6 (2002), 147-159.)

The array structure which is constructed of discoid (or nearly discoid) π-electron conjugated molecules (such as porphyrin) through π-π stacking is expected to function as a channel chain (or a pipe) that permits electrons to flow in the direction of stacking. As compared with an ordinary conductive chain molecule, it has a larger current passage and hence it flows more current. Its use as an electron channel for solar cells is under study.

For the array structure 4 to be used as a conductor, it is necessary that the direction of stacking coincide with the direction of current flow (along the line connecting the electrodes 5 and 6 to each other), as shown in FIG. 1A, so that contact resistance on the electrodes 5 and 6 is minimized and the ends of the array structure 4 come into close contact with the surfaces of the electrodes 5 and 6.

π-electron conjugated molecules without side chains should not be used for the array structure because they do not orient and stack on the electrode surface in the desired direction. (Side chains control adsorption to the electrode surface and make the discoid skeletons to selectively orient parallel to the electrode surface.) Otherwise, the resulting array structure is unable to flow current or sustain current flow despite its high conductivity, as shown in FIG. 1B. In addition, the discoid skeleton of the π-electron conjugated molecule at the end of the array structure should be as close to the electrode surface as possible, with the distance being less than 0.34-0.36 nm. Otherwise, delocalization of electrons does not take place in the interface, which prevents reduction of contact resistance.

This embodiment is intended to address the foregoing problems as follows. First, as explained in the first example later, a solution is prepared which contains an adequate amount of the π-electron conjugated molecule 1 which has the flexible side chains 3 as shown in FIG. 2. Next, the resulting solution is applied to the electrode 5 or 6 by casting or the like. After solvent evaporation, the coating layer undergoes optional annealing. In this way there is formed a molecular monolayer which tightly adheres to the surface of the electrode 5 or 6. (This layer is referred to as the adsorbing molecule 9.) On the adsorbing molecule 9 is placed the π-electron conjugated molecule through π-π stacking, thereby forming the array structure 4. The π-electron conjugated molecule to be stacked is not specifically restricted so long as it is capable stacking on the π-electron conjugated molecule 1 (or the adsorbing molecule 9). In this embodiment, molecules of the same kind as the π-electron conjugated molecule 1 are used for stacking. However, it is possible to use π-electron conjugated molecules different in kind from the a-electron conjugated molecule 1.

The first molecular layer of the array structure 4 is formed from the π-electron conjugated molecule 1 (or the absorbing molecule 9) as its flexible side chains 3 adsorb to the surface of the electrode 5 (or 6), as shown in FIG. 1C. As the result, the nearly discoid skeleton 2 orient parallel to and becomes fixed (or closely adheres) to the surface of the electrode 5 (or 6). Thus, the π-electrons of the skeleton 2 are delocalized on the electrode. This leads to a reduced contact resistance between the array structure 4 and the electrode 5 (or 6).

The second and subsequent molecular layers of the array structure 4 are placed such that the nearly discoid skeletons of the upper layers are parallel to the nearly discoid skeleton 2 of the adsorbing molecule 9 on the electrode surface. This layer arrangement is caused by the π-π mutual actions. Thus, the array structure permits current to flow efficiently in the direction of stacking by the mutual action between π-electrons.

According to the embodiment mentioned above, it is possible to obtain the sturdy functional molecular element 10 which has a very small contact resistance between the π-electron conjugated molecule and the electrode and which permits current to flow in the direction in which the constituents of the array structure 4 are stacked up.

SECOND EMBODIMENT

Figure 3:
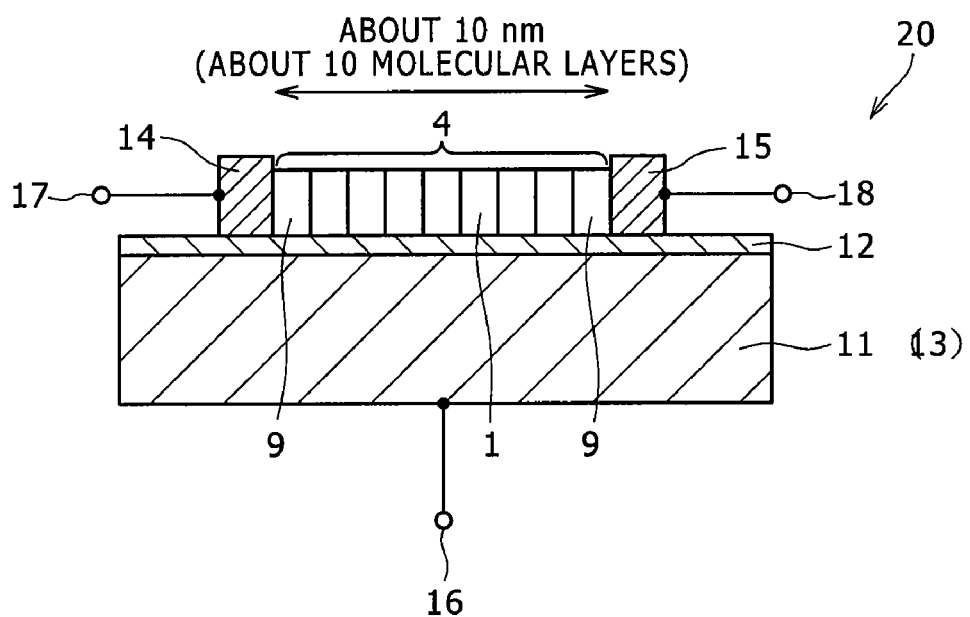
FIG. 3 is a sectional view of the insulated gate field effect transistor according to a second embodiment.

A second embodiment is concerned mostly with the functional molecular device corresponding to claims 1 to 3 and 17 to 20, which is an insulated gate field effect transistor in which the functional molecular element 10 (mentioned in the first embodiment) is held between opposing electrodes. FIG. 3 is a sectional view illustrating the structure of the insulated gate field effect transistor 20 according to this embodiment.

The insulated gate field effect transistor 20 shown in FIG. 3 is formed on a doped silicon substrate 11 which functions also as the gate electrode 13 for current control. The silicon substrate 11 has the gate insulating film 12 (or a silicon oxide film) formed on the surface thereof. On the gate insulating film 12 are opposing gold electrodes (or the source electrode 14 and the drain electrode 15). Between these electrodes is the array structure 4 explained in the first embodiment above.

Of the π-electron conjugated molecules 1 constituting the array structure 4, the ones closest to the source electrode 14 and the drain electrode 15 and corresponding to the first molecular layer are fixed to these electrodes. (Such molecules are referred to as the adsorbing molecule 9.) In other words, the adsorbing molecule 9 adsorbs to the surface of the electrode 14 or 15 by its flexible side chains 3, as explained above with reference to FIG. 1C. As the result, the nearly discoid skeleton 2 closely orients parallel to the surface of the electrode 14 or 15. Orientation in this manner is the reason why c-electrons in the skeleton 2 are delocalized on the electrode. This leads to a reduced contact resistance between the array structure 4 and the electrode 14 or 15.

The second and subsequent molecular layers of the array structure 4 are placed such that the nearly discoid skeletons of the upper layers are parallel to the nearly discoid skeleton 2 of the adsorbing molecule 9 on the electrode surface. This layer arrangement is caused by the π-7 mutual actions.

Thus there is formed the sturdy array structure 4 between the opposing electrodes (or the source electrode 14 and the drain electrode 15), which has a very small contact resistance at its interface with the electrode and which permits current to flow only in the direction of stacking.

The gate electrode 13 for current control extends parallel to the direction of layer stacking (or current flow) in the array structure 4. Upon voltage application, the gate electrode 13 produce an electric field in the direction perpendicular to the direction of current flow in the array structure 4, and this electric field controls the conductivity of the array structure 4.

The gap (corresponding to the gate length) between the source electrode 14 and the drain electrode 15 is approximately 10 nm (which is equivalent to about 10 molecular layers).

The functional molecular device according to this embodiment is constructed such that the array structure 4 constituting the functional molecular element 10 is arranged between the opposing electrodes. Therefore, it has a small contact resistance between the π-electron conjugated molecule 1 and both the source electrode 14 and the drain electrode 15, as explained above regarding the functional molecular element 10. Hence it permits the source electrode 14 and the drain electrode 15 to flow current efficiently in the direction of layer stacking in the array structure 4. It works as the insulated gate field effect transistor 20 in nanometer size having outstanding electric properties.

THIRD EMBODIMENT

A third embodiment is concerned mostly with the functional molecular element corresponding to claims 1, 4, and 5, and the functional molecular device corresponding to claims 17 to 20, which is an insulated gate field effect transistor.

Figure 4A:
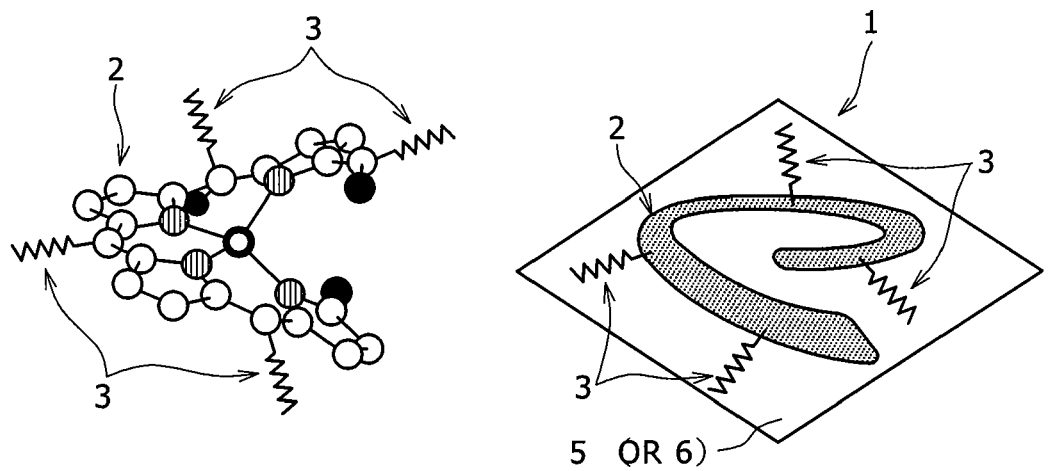
FIG. 4A is a schematic diagram showing difference in structure of the π-electron conjugated molecule constituting the functional elements according to the first embodiment and FIG. 4B is a schematic diagram showing difference in structure of the π-electron conjugated molecule constituting the functional elements according to a third embodiment.
Figure 4B:
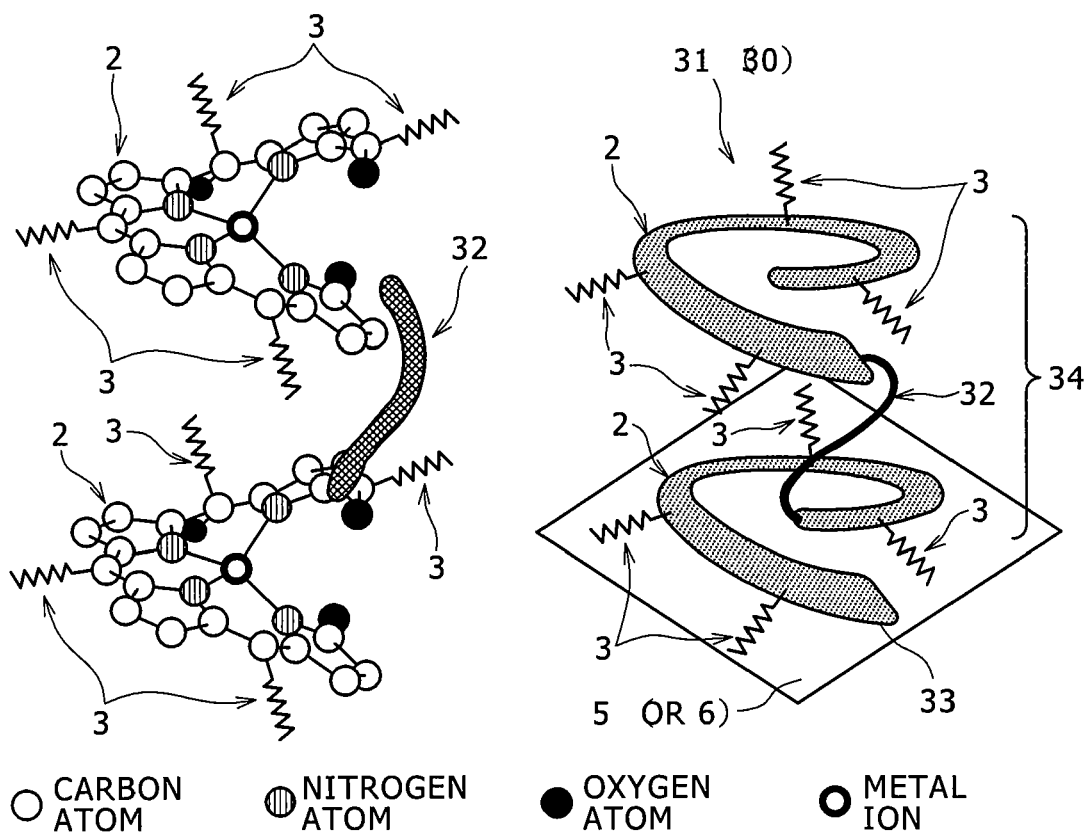

FIGS. 4A and 4B are schematic diagrams showing respectively the structure of the π-electron conjugated molecules 1 and 31 each constituting the functional molecular elements according to Embodiments 1 and 3.

FIG. 4A, left part, is a schematic diagram showing the stereostructure of the nearly discoid skeleton 2 of the π-electron conjugated molecule 1. In this figure, carbon atoms, nitrogen atoms, oxygen atoms, and metal ion M constituting the skeleton 2 are indicated by spheres, with hydrogen atoms omitted and side chains 3 simplified. The π-electron conjugated molecule 1 has two opposing carbonyl (C=O) groups at the cleavage of the open porphyrin ring. Therefore, the skeleton 2 takes on a nearly discoid shape slightly twisted out of plane.

FIG. 4A, right part, is a schematic diagram showing how the π-electron conjugated molecule 1 adsorbs to the electrode 5 (or 6), with the twisted nearly discoid skeleton 2 being simplified and represented by an open annular ring. Incidentally, the skeleton 2 in further simplified form is schematically represented by a disc in FIG. 1C.

Since the nearly discoid skeleton 2 is limited to one in the π-electron conjugated molecule 1, it is necessary to stack more than one unit of the π-electron conjugated molecule 1 by intramolecular π-n stacking in order to form the array structure 4.

By contrast, the π-electron conjugated molecule 31 used in the third embodiment has two identical or different units of the nearly discoid skeleton 2 which are connected to each other by a linkage chain. For example, it is a molecule composed of two or more units of the π-electron conjugated molecule 1 which are connected to each other by a linkage chain 32 attached to the carbonyl groups. FIG. 4B shows two units of the π-electron conjugated molecule 1 connected to each other, in the same way of representation as in FIG. 4A. There are no restrictions in the number of molecules to be connected; however, an excessively large number of molecules leads to difficulties in synthesis.

Although the linkage chain 32 should preferably be one which is formed by covalent bond from the standpoint of stability, it is not restricted in the type of bond so long as it is able to connect the nearly discoid skeleton 2.

FIG. 4B, right part, is a schematic diagram showing how the π-electron conjugated molecule 31 adsorbs to the electrode 5 (or 6). It is apparent from comparison between the right part of FIG. 4A and the right part of FIG. 4B that the π-electron conjugated molecule 31 is fixed to and oriented toward the electrode in the same way as the π-electron conjugated molecule 1. Such orientation is accomplished by forming a closely adhering molecular monolayer on the electrode surface in the following manner. First, a solution is prepared which contains the π-electron conjugated molecule 31 in an adequate amount. Then, this solution is applied to the electrode 5 (or 6) by casting or the like. This coating step is followed by solvent evaporation and optional annealing.

Thus, the flexible side chains 3 attached to the terminal one of a plurality of the nearly discoid skeleton 2 contained in the π-electron conjugated molecule 31 adsorb to the surface of the electrode 5 (or 6), so that the terminal one of the nearly discoid skeletons 2 orients parallel to and adheres to the electrode surface, as in the case of the skeleton 2 of the π-electron conjugated molecule 1, thereby forming the adsorbing skeleton 33. The rest of the nearly discoid skeletons 2, which are connected to the adsorbing skeleton 33 by the linkage chain 32, readily stack up on the nearly discoid skeleton underneath, thereby forming the array structure 34. The skeletons 2 in the array structure 34 stack up in the direction which is determined by the surface of the adsorbing skeleton 33 orienting parallel to the electrode surface. The array structure 34 formed in this manner permits current to flow efficiently in the stacking direction owing to the mutual action of π-electrons.

According to the embodiment mentioned above, it is possible to obtain the sturdy functional molecular element 30 which has a very small contact resistance between the π-electron conjugated molecule and the electrode and which permits current to flow in the direction in which the constituents of the array structure 34 are stacked up.

Figure 5:
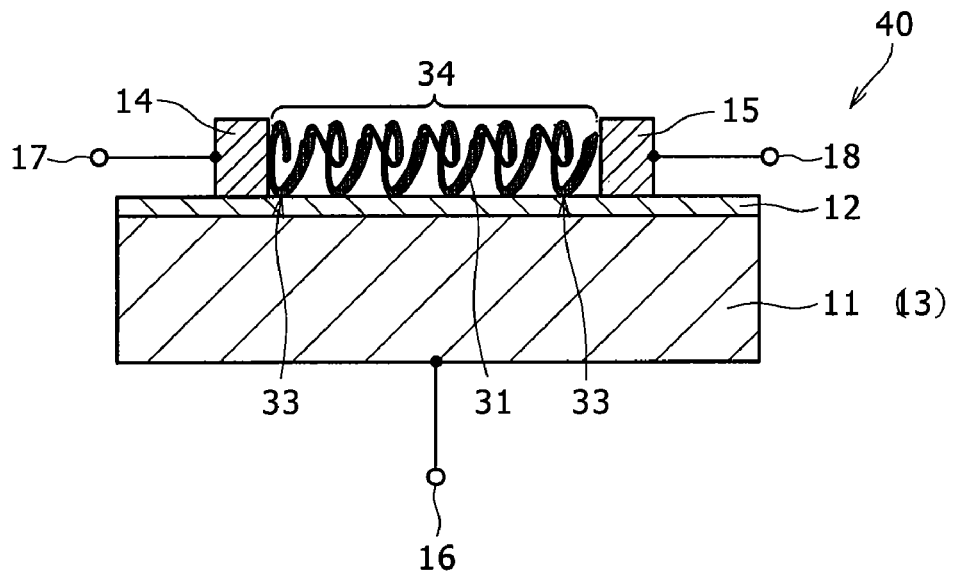
FIG. 5 is a sectional view of the insulated gate field effect transistor according to the third embodiment.

FIG. 5 is a sectional view showing the insulated gate field effect transistor 40 according to the third embodiment. The insulated gate field effect transistor 40 has the array structure 34 consisting of a monolayer of the π-electron conjugated molecule 31 in which six units (for example) of the nearly discoid skeleton 2 are serially connected to each other, whereas the insulated gate field effect transistor 20 has the array structure 4 consisting of a plurality of molecular layers.

Except for the foregoing, the insulated gate field effect transistor 40 is identical with the insulated gate field effect transistor 20; therefore, detailed description about it is not given. It has a small contact resistance between the π-electron conjugated molecule 31 and both the source electrode 14 and the drain electrode 15, like the insulated gate field effect transistor 20. Hence it permits the source electrode 14 and the drain electrode 15 to flow current efficiently in the direction of layer stacking in the array structure 34. It works as the insulated gate field effect transistor 40 in nanometer size having outstanding electric properties.

Moreover, the array structure 34 consisting of a monolayer of the π-electron conjugated molecule 31 in which six units of the nearly discoid skeleton 2 are connected to each other may be replaced by an array structure consisting of two monolayers formed respectively on the source electrode 14 and the drain electrode 15, each monolayer being composed of a π-electron conjugated molecule having three units of the nearly discoid skeleton 2 connected to each other.

EXAMPLES

The invention will be described in more detail with reference to the following examples.

First Example

Preparation of Functional Molecular Element

In this example, the functional molecular element was prepared from the π-electron conjugated molecule 7 (corresponding to the π-electron conjugated molecule 1 mentioned above) having the nearly discoid skeleton 2, which is represented by the structural formula 2 below. The π-electron conjugated molecule 7 is a zinc complex of a biladienone derivative having (as the flexible side chain 3) dodecyl groups ($—C_{12}H_{25}$) connecting to phenyl groups at their para positions.

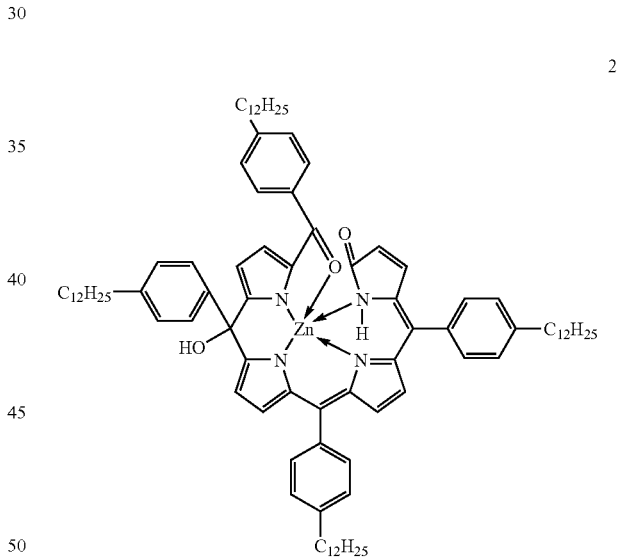

2

The functional molecular element was prepared by casting in the following manner.

First, a glass substrate (measuring 30 by 30, 1.1 mm thick) underwent sputtering to form a chromium layer (15 nm thick) thereon. On the chromium layer was formed a gold polycrystalline thin film (200 nm thick), which serves as a gold electrode. The coated substrate was cleaned for 15 minutes by using an ultraviolet ozone cleaning apparatus.

Next, the gold electrode on the glass substrate was coated with a film of the π-electron conjugated molecule 7 by casting from a solution in THF (tetrahydrofuran), followed by solvent evaporation over 72 hours under the saturated vapor pressure of THF.

Figure 6:
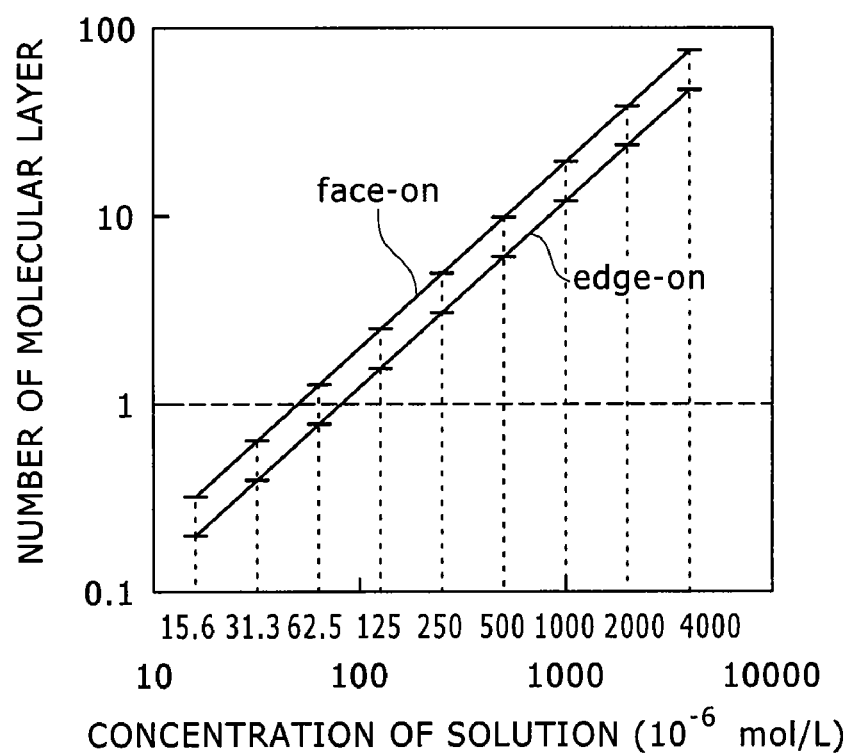
FIG. 6 is a graph showing the relation between the concentration of the solution used to form the cast film and the number of molecular layers to be stacked up in the cast film according to a first example.

FIG. 6 is a graph showing the relation (obtained by calculations) between the concentration of the solution used to form the cast film and the number of molecular layers formed on the cast film. The calculations were carried out according to the molecular orbital method with the help of MOPAC 2002 for a structure-optimized molecular size. The π-electron conjugated molecule 7 was assumed to take on both edge-on arrangement and face-on arrangement. The graph in FIG. 6 was used to determine the concentration of the solution that gives a cast film composed of 0.2 to tens of molecular layers. The solution of thus calculated concentration was used to make the cast film in the experiment.

Figure 7A:
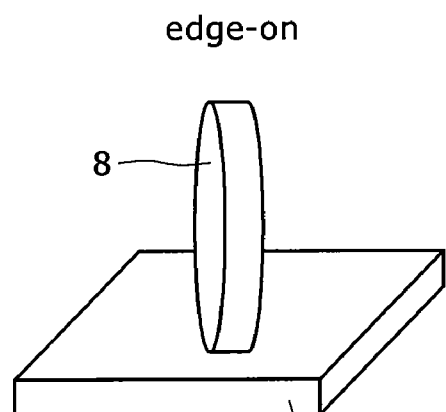
Figure 7B:
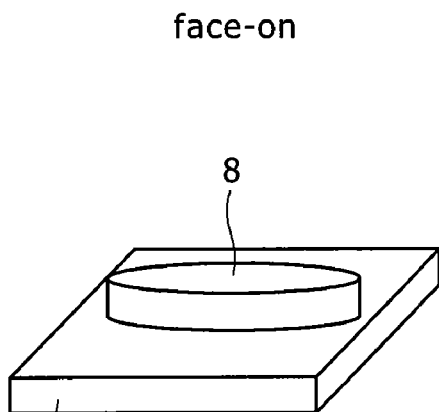
Figure 7C:
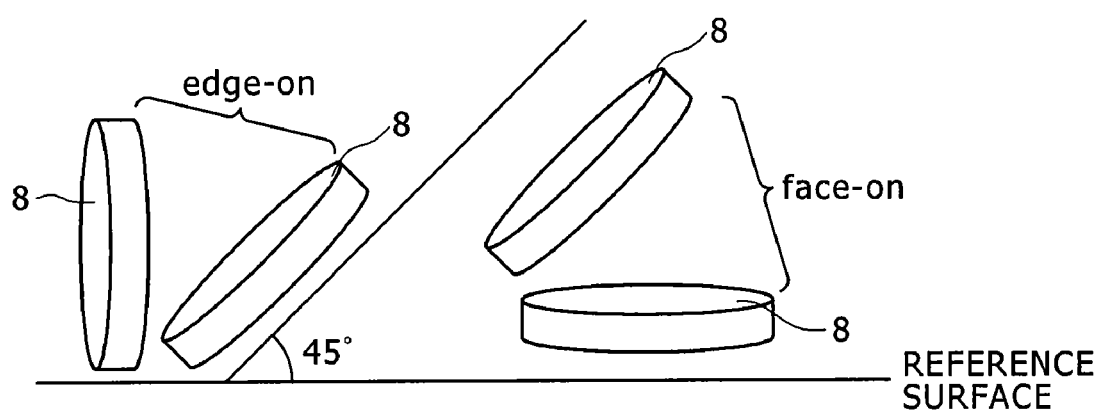

FIGS. 7A to C are schematic diagrams showing the π-electron conjugated molecule 7 which adsorbs to the surface of the gold electrode in the edge-on mode or face-on mode. FIG. 7A represents adsorption in the edge-on mode, with the face 8 of the nearly discoid skeleton 2 being perpendicular to the surface of the gold electrode. FIG. 7B represents adsorption in the face-on mode, with the face 8 of the nearly discoid skeleton 2 being parallel to the surface of the gold electrode. Broadly speaking, the edge-on mode includes the case in which the face 8 makes an angle larger than 45° with respect to the reference surface, and the face-on mode includes the case in which the face 8 makes an angle smaller than 45° with respect to the reference surface, as shown in FIG. 7C. It was found (as mentioned later) that the 7π-electron conjugated molecule 7 in this example adsorbs to the surface of the gold electrode in the face-on mode shown in FIG. 7B.

The cast film prepared as mentioned above was tested as follows, with or without annealing at 120° C. for 15 minutes.

Examination of orientation by highly sensitive infrared reflection absorption spectroscopy The cast film was examined for orientation of molecules by means of highly sensitive infrared reflection absorption spectroscopy. Owing to the surface selection rule, this analytical method sensitively detects only the vibration mode in which the dipole moment changes in the direction perpendicular to the surface of the substrate (gold electrode). It is possible to collect information about the orientation of molecules by comparing the infrared reflection absorption spectrum (IRA spectrum) with the transmission absorption spectrum for ordinary bulk substance (this comparison reveals the vibration mode responsible for the spectrum observed).

Each sample of the cast film was examined for IRA spectrum by using RAS accessory detector (with an incident angle of 75°) from Harrick Scientific Product, Inc. This detector employs MCT (Mercury Cadmium Telluride) and has a resolution of 2 $cm^{-1}$. Measurement was repeated 2000 to 4000 times.

Orientation of Alkyl Chain

The orientation was analyzed by examining the absorption spectrum of alkyl chains in the high-frequency region.

Figure 8:
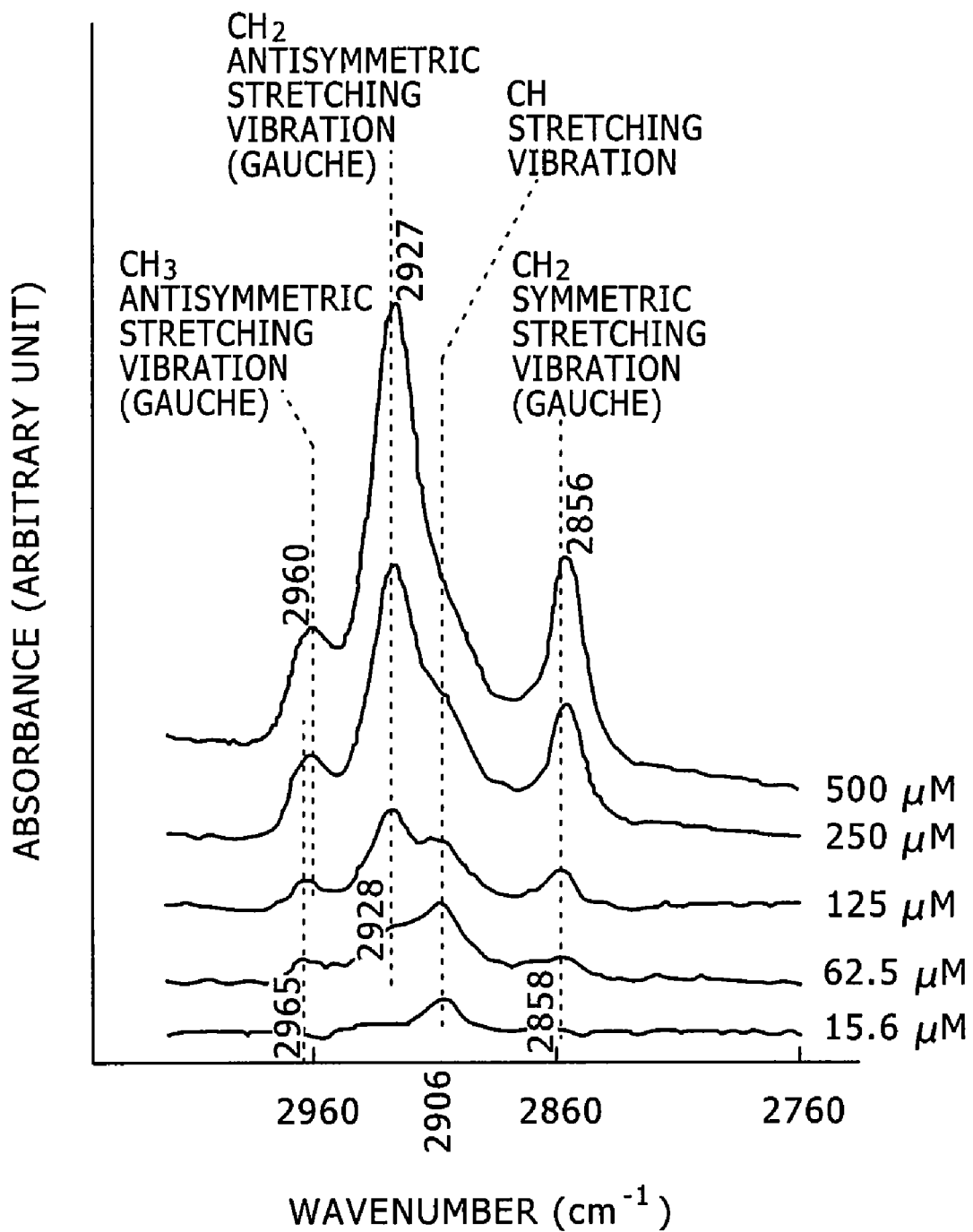
FIG. 8 is a graph showing the relation between the concentration of the solution used to form the cast film and the IRA spectrum of the cast film in the high-frequency region according to the first example.

FIG. 8 is a diagram showing the relation between the concentration of the solution used to form the cast film and the IRA spectrum of the cast film in the high-frequency region.

It is noted that the cast film formed from the solution with the lowest concentration of 15.6 μmol/L merely gave an absorption spectrum at 2906 $cm^{-1}$. This absorption peak is assigned to the antisymmetric stretching vibration band of $CH_2$; however, this wavenumber is shifted by 10 $cm^{-1}$ to the lower side from that of the absorption peak assigned to the antisymmetric stretching vibration band of $CH_2$ in the transconformation. In addition, any peak assigned to the symmetric stretching vibration band of $CH_2$ was not observed.

Figure 9A:
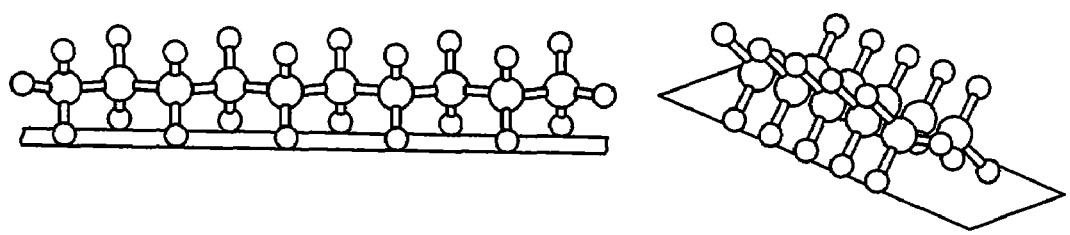
FIGS. 9A and 9B are a schematic diagram showing the orientation of the alkyl chain adsorbing to the gold electrode.
Figure 9B:
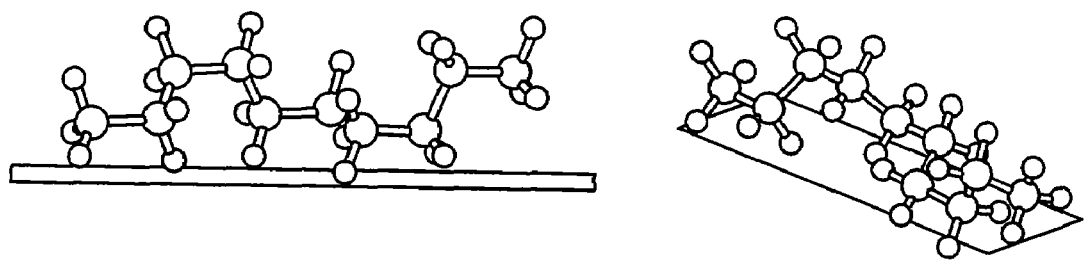

FIGS. 9A and 9B illustrate the orientation of the alkyl chain adsorbing to the gold electrode. FIG. 9A shows the flat-on all-trans configuration in side view and perspective view. FIG. 9B shows the gauche configuration in side view and perspective view. The flat-on all-trans configuration shown in FIG. 9A is characterized in that methylene groups adjoining to each other along the carbon chain take on the mutually trans configuration, with one hydrogen atom of the methylene group adsorbing to the surface of the substrate, so that the methylene groups orient in one direction.

Consequently, carbon atoms are arranged at approximately the same height from the surface of the substrate, and this leads to the flat-on structure in which the carbon skeleton is contained almost in one plane parallel to the substrate. By contrast, the gauche configuration shown in FIG. 9B is the most popular structure that appears in the bulk substance; it differs from the flat-on all-trans configuration in that the methylene groups do not regularly orient.

Figure 10A:
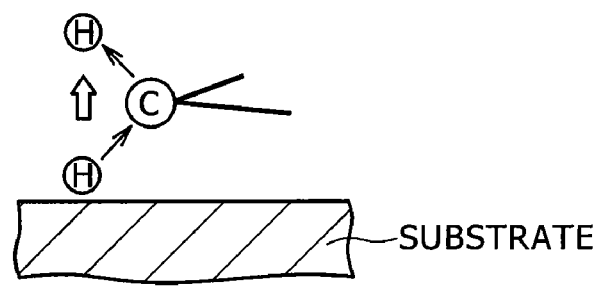
FIG. 10A is a schematic diagram illustrating how the methylene group varies in orientation mode.
Figure 10B:
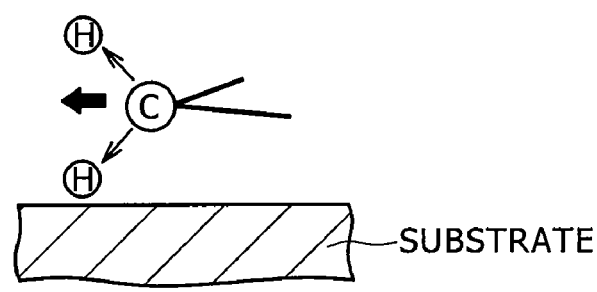
FIG. 10B is a schematic diagram illustrating how the methylene group varies in vibration mode.
Figure 10C:
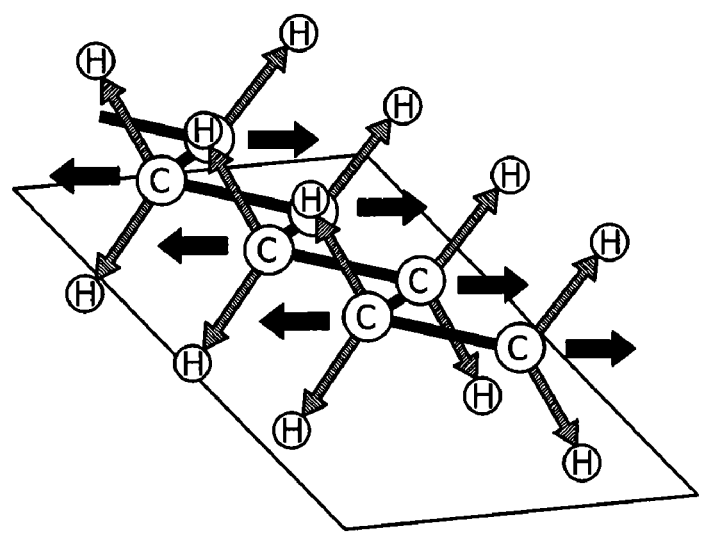
FIG. 10C is a schematic diagram illustrating how the methylene group varies in change in direction of dipole moment when the alkyl chain takes on the flat-on all-trans configuration according to the first example.

FIGS. 10A, 10B, and 10C are diagrams illustrating the orientation of the methylene groups (with the alkyl chain taking on the flat-on all-trans configuration) and the relation between the vibration mode and the change in direction of the dipole moment. It is noted that the methylene groups orient such that two hydrogen atoms vertically overlap each other on the surface of the substrate. Therefore, the antisymmetric stretching vibration of $CH_2$ shown in FIG. 10A causes the dipole moment to change in the direction perpendicular to the surface of the substrate, whereas the symmetric stretching vibration of $CH_2$ shown in FIGS. 10B and 10C causes the dipole moment to change in the direction parallel to the surface of the substrate. Incidentally, convention is used in FIGS. 10A, 10B, and 10C that white arrows indicate the dipole moment that changes in the direction perpendicular to the surface of the substrate and black arrows indicate the dipole moment that changes in the direction parallel to the surface of the substrate.

As mentioned above, the highly sensitive infrared reflection absorption spectroscopy gives an intense peak due to the vibration mode in which the dipole moment changes in the direction perpendicular to the surface of the substrate. Therefore, it gives only absorption peaks due to the antisymmetric stretching vibration of $CH_2$ but does not give absorption peaks due to the symmetric stretching vibration of $CH_2$ if the alkyl chain takes on the flat-on all-trans configuration. By contrast, such selectivity does not exist if the alkyl chain takes on the gauche configuration in which the orientation of methylene groups has no regularity; in this case, there is no difference between the absorption spectrum due to the antisymmetric stretching vibration of $CH_2$ and the absorption spectrum due to the symmetric stretching vibration of $CH_2$.

The foregoing suggests that the cast film formed from the solution with a concentration of 15.6 μmol/L did not give the absorption spectrum due to the symmetric stretching vibration because the alkyl chain takes on the flat-on all-trans configuration for adsorption to the surface of the substrate. In addition, it may be hypothesized that hydrogen atoms adsorb to the surface of the substrate for mutual action with gold atoms constituting the substrate on the basis of observation that the peak due to the symmetric stretching vibration band for gauche configuration appears at 2928 $cm^{-1}$ while the peak due to the antisymmetric stretching vibration band for flat-on all-trans configuration appears at 2906 $cm^{-1}$, with a shift toward the lower wavenumber. (See M. Yamamoto et al., J. Phys. Chem. B, 104, 7363 (2000).)

It should be noted from FIG. 8 that all of the three peaks due to the antisymmetric stretching vibration of $CH_3$, antisymmetric stretching vibration of $CH_2$, and symmetric stretching vibration of $CH_2$ appeared at 2960, 2927, and 2856 $cm^{-1}$, respectively. This indicates that the cast film composed of many molecular layers placed one over another has the gauche configuration as the major structure like the bulk substance. (See R. G. Snyder, H. L. Strauss and C. A. Elliger, J. Phys. Chem., 86, 5145 (1982).)

Figure 11:
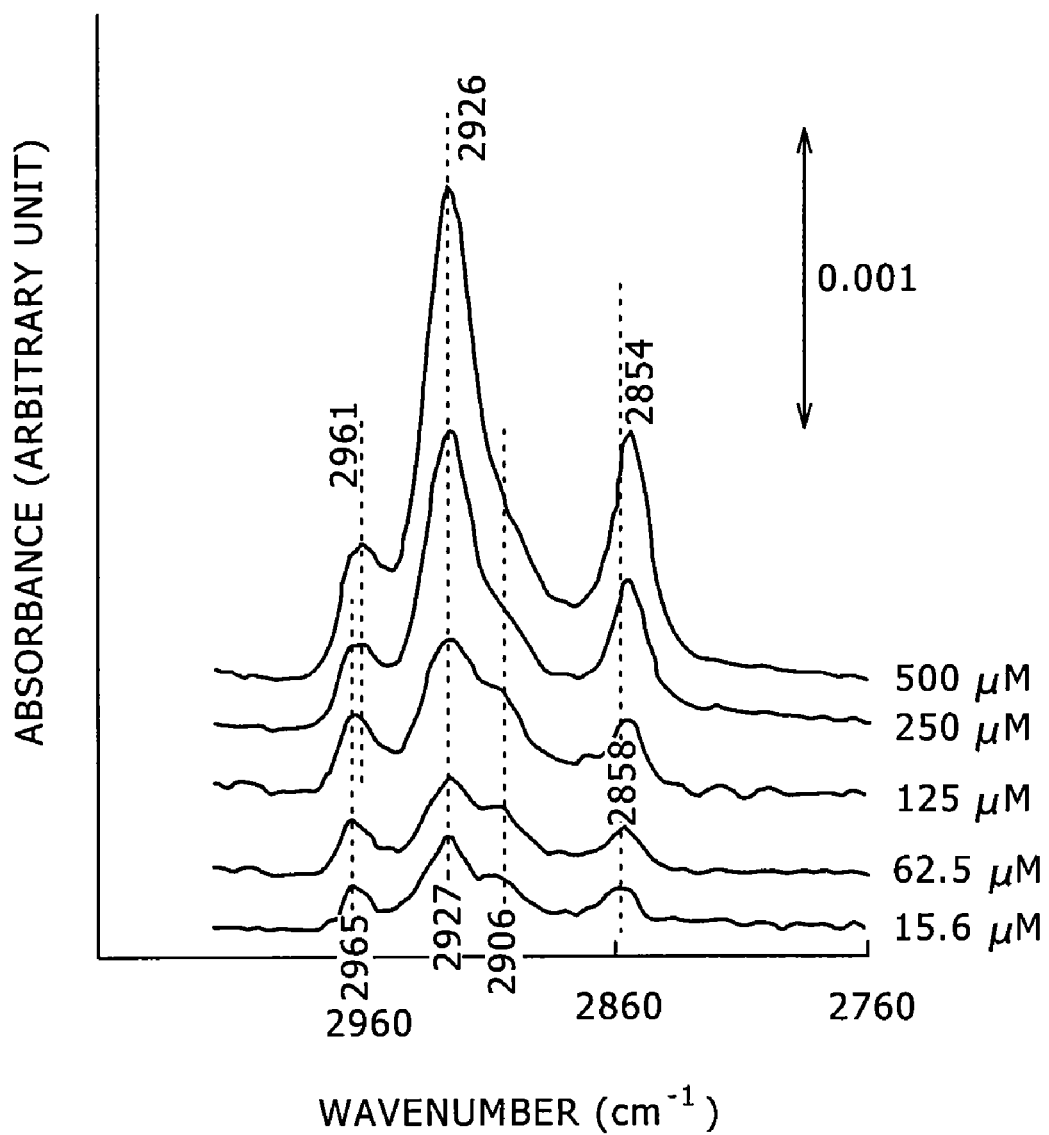
FIG. 11 is a graph showing the relation between the concentration of the solution used to form the cast film and the IRA spectrum of the cast film in the high-frequency region (same as in FIG. 8) measured after annealing at 120° C. according to the first example.

FIG. 11 is a diagram showing the relation between the concentration of the solution used to form the cast film and the IRA spectrum of the cast film (with annealing at 120° C.) in the same high-frequency region as in FIG. 8. Comparison between FIG. 11 and FIG. 8 reveals that the IRA spectrum changes only little irrespective of the concentration of the solution used. In fact, the cast film formed from the solution with a concentration of 15.6 µmol/L merely gave a small absorption peak due to the antisymmetric stretching vibration of $CH_2$ at 2906 $cm^{-1}$. Even the cast film (with annealing) formed from the solution with a concentration of 15.6 µmol/L has the methyl group taking on the gauche configuration. This suggests that annealing changed the structure of the adsorbed alkyl chain.

Figure 12:
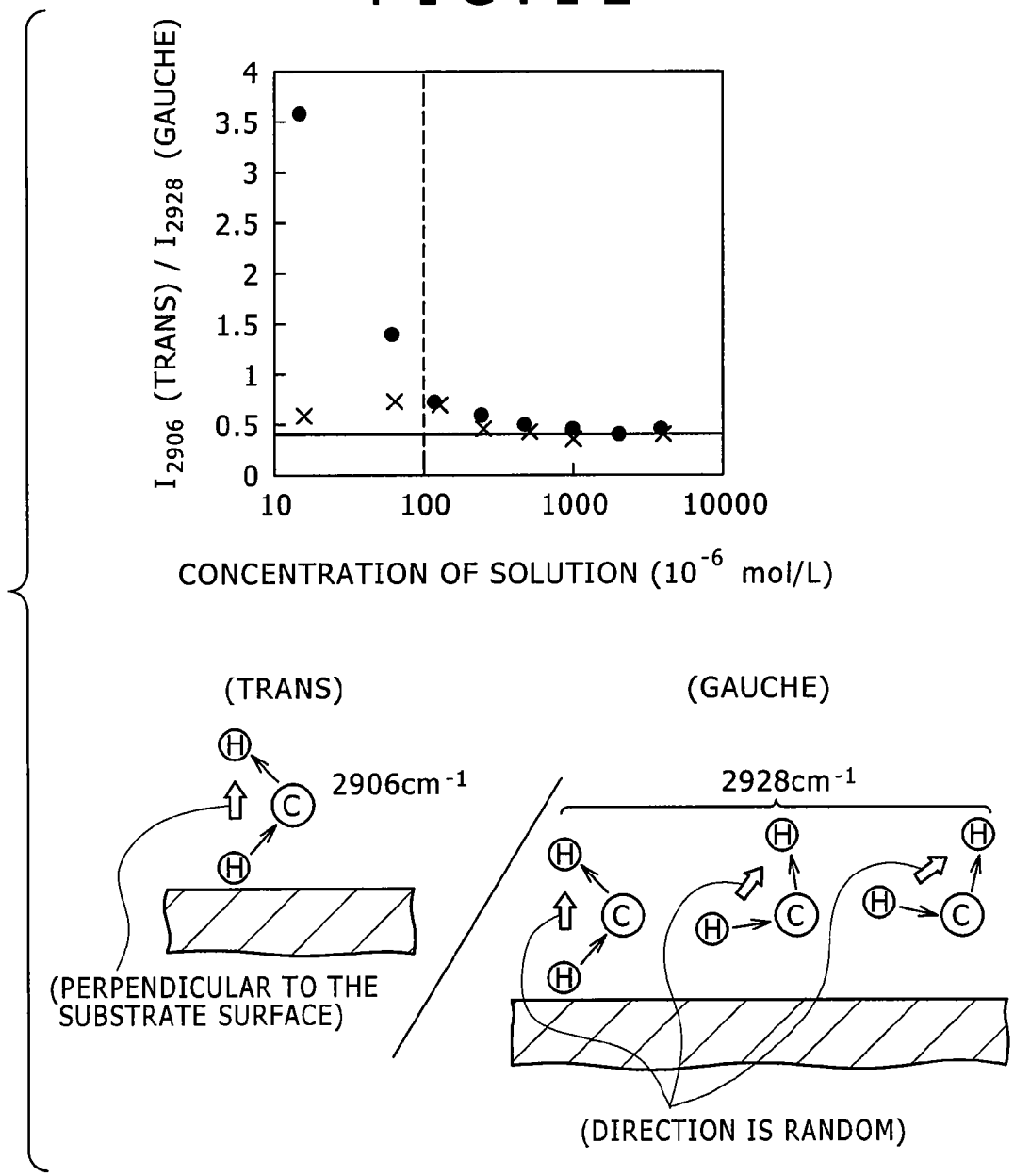
FIG. 12 is a graphs showing the relation between $I_{2906}/I_{2928}$ and the concentration of the solution used to form the cast film, the former representing the ratio of $I_{2906}$ (the absorption intensity at 2906 cm$^{-1}$) to $I_{2928}$ (the absorption intensity at 2928 cm$^{-1}$) according to the first example.

FIG. 12 is a graph showing how annealing affects the relation between $I_{2906}/I_{2928}$ and the concentration of the solution used to form the cast film, the former representing the ratio of $I_{2906}$ (the absorption intensity of the antisymmetric stretching vibration band at 2906 $cm^{-1}$ due to flat-on all-trans configuration) to $I_{2928}$ (the absorption intensity of the antisymmetric stretching vibration band at 2928 $cm^{-1}$ due to gauche configuration). In FIG. 12, black points denote the values before annealing and cross marks denote the values after annealing. The horizontal solid line represents the values of the transmission absorption spectrum for the bulk substance and the vertical dotted line represents the upper limit of the concentration which presumably forms a molecular monolayer on the gold electrode.

It is noted from FIG. 12 that the cast film without annealing is composed of the first molecular layer (adsorbing to the gold electrode) in which most methylene groups take on the flat-on all-trans configuration and the second and upper molecular layers in which most methylene groups take on the gauche configuration as in the bulk substance. It is also noted that the cast film with annealing is composed of molecular layers in all of which (including the first layer) the gauche configuration dominates as in the bulk substance.

Figure 13:
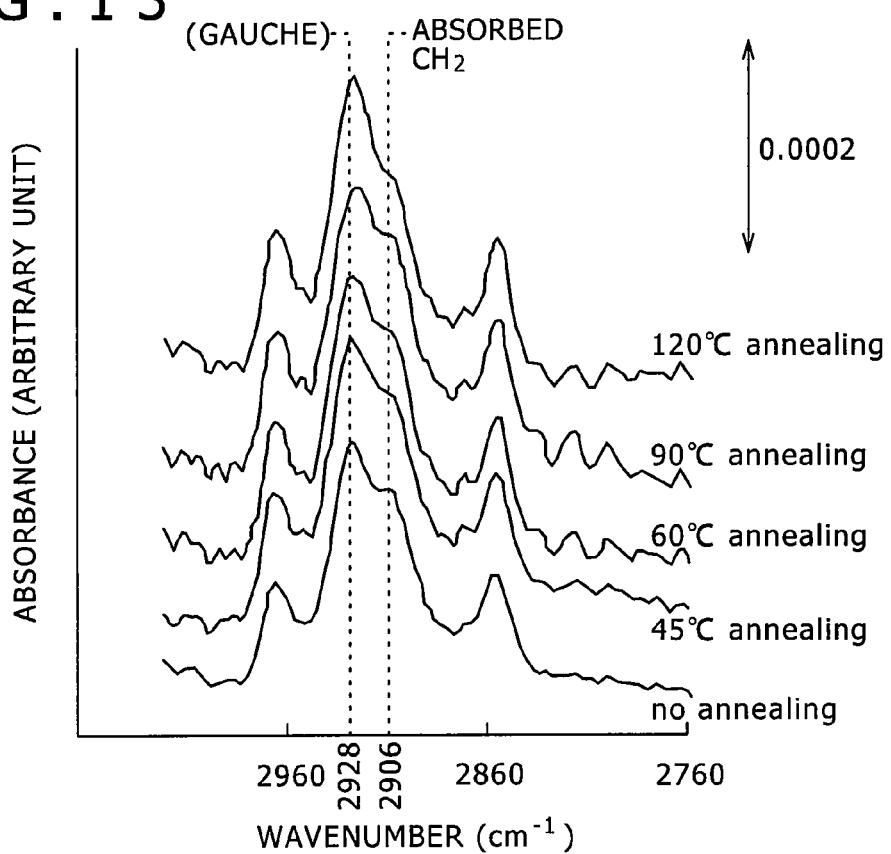
FIG. 13 is a graph showing the ERA spectrum of the cast film which varies depending on the annealing temperature according to the first example.
Figure 14:
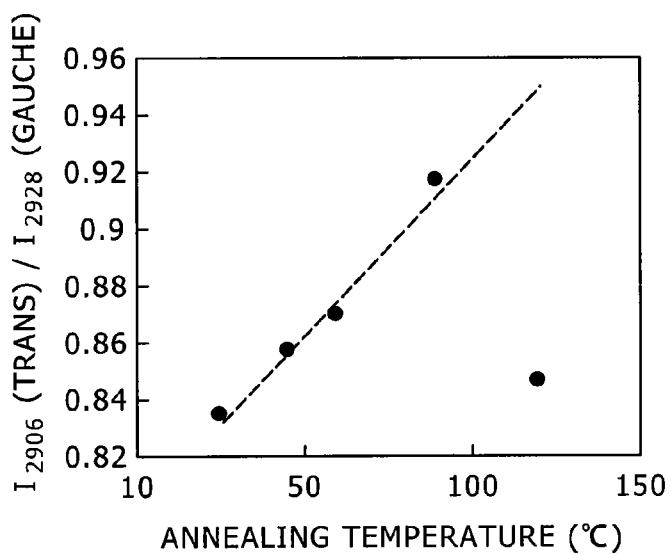
FIG. 14 is a graphs showing the relation between $I_{2906}/I_{2928}$ and the annealing temperature, the former representing the ratio of 12906 (the absorption intensity at 2906 cm$^{-1}$) to $I_{2928}$ (the absorption intensity at 2928 cm$^{-1}$) according to the first example.

FIG. 13 is an IRA spectrum which illustrates how the cast film (composed of a little over one molecular layer) formed from the solution with a concentration of 125 µmol/L varies depending on the annealing temperature in desorption temperature of alkyl chains adsorbing to the substrate. FIG. 14 is a diagram showing the relation between $I_{2906}/I_{2928}$ and the annealing temperature, the former being the ratio of absorption intensity at 2906 $cm^{-1}$ and 2928 $cm^{-1}$ in the spectrum shown in FIG. 13.

It is noted from FIG. 13 that the spectrum greatly changes as the annealing temperature changes from 90° C. to 120° C. It is also noted from FIG. 14 that the absorption intensity $I_{2906}$ at 2906 $cm^{-1}$ (denoting the presence of flat-on all-trans configuration) increases as the annealing temperature increase up to 90° C., while it sharply decreases as the annealing temperature increases further from 90° C. to 120° C. The trend up to 90° C. coincides with the report that adsorption of carbon chains to the substrate is improved by annealing. (See M. Yamamoto et al., J. Phys. Chem. B, 104, 7363 (2000) given above.) It was also found that annealing at 90° C. to 120° C. brings about desorption of alkyl chains or at least changes the flat-on all-trans configuration into another configuration. Therefore, it is desirable to perform annealing at a temperature lower than 90° C.

The skeleton having the nearly discoid linear tetrapyrrole structure was examined for orientation by noting the absorption spectrum in the medium wavenumber region.

Figure 15:
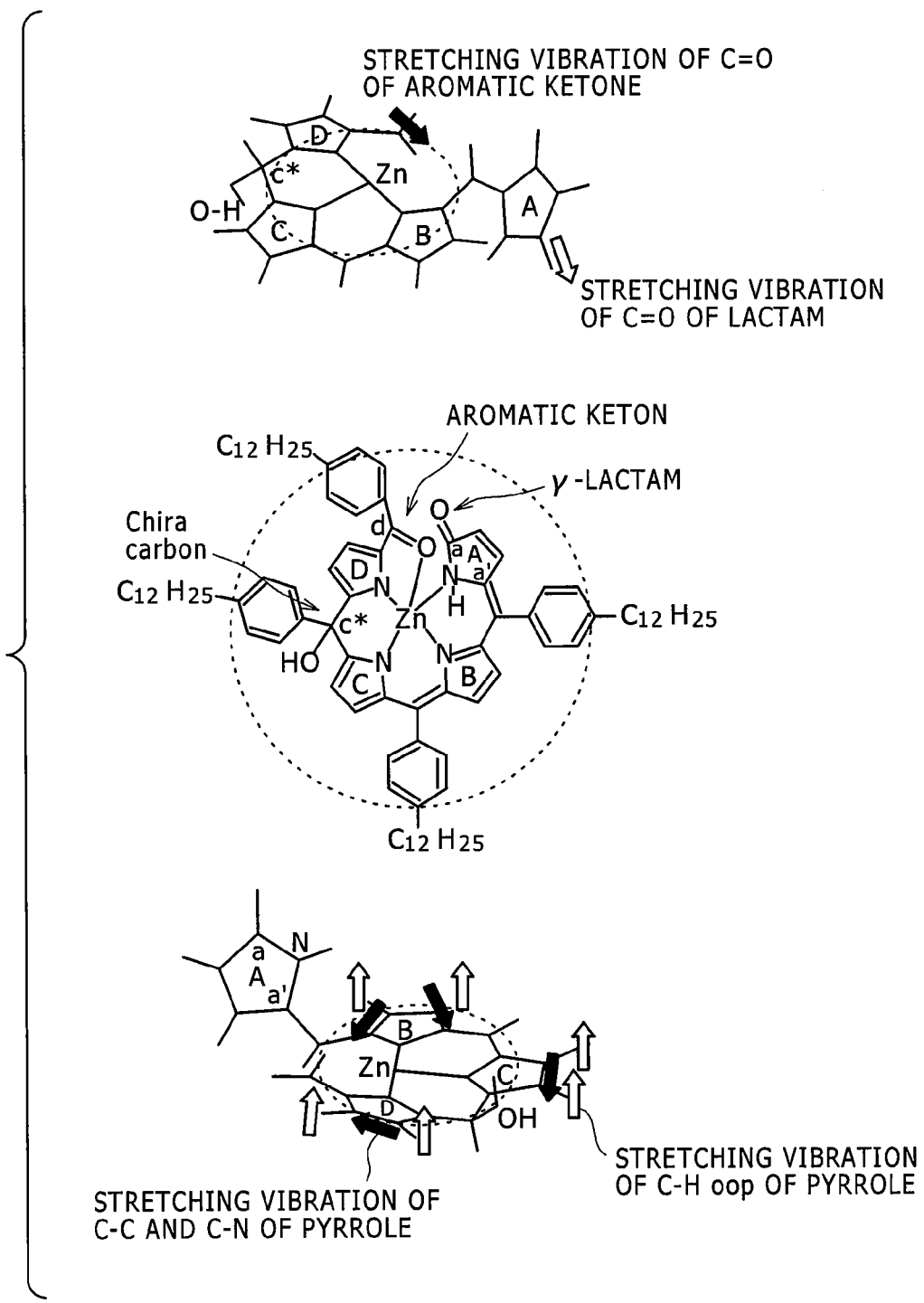
FIG. 15 is a diagram illustrating the stereostructure of the π-electron conjugated molecule 7 and its characteristic vibration mode according to the first example.

FIG. 15 is a diagram illustrating the stereostructure of the skeleton of the π-electron conjugated molecule 7 and the vibration mode denoting the direction of orientation of the skeleton. It is noted from FIG. 15 (upper part) that the stretching vibration of the C=O bond of lactam and the C=O bond of aromatic ketone take place such that their dipole moments change respectively in the directions perpendicular and parallel to the surface of the disc of the skeleton. It is also noted from FIG. 15 (lower part) that the stretching vibration of the C—C bond and C—N bond of the pyrrole ring and the out-of-plane bending vibration of the C—H bond of the pyrrole ring take place such that their dipole moments change respectively in the directions perpendicular and parallel to the surface of the disc of the skeleton.

Figure 16A:
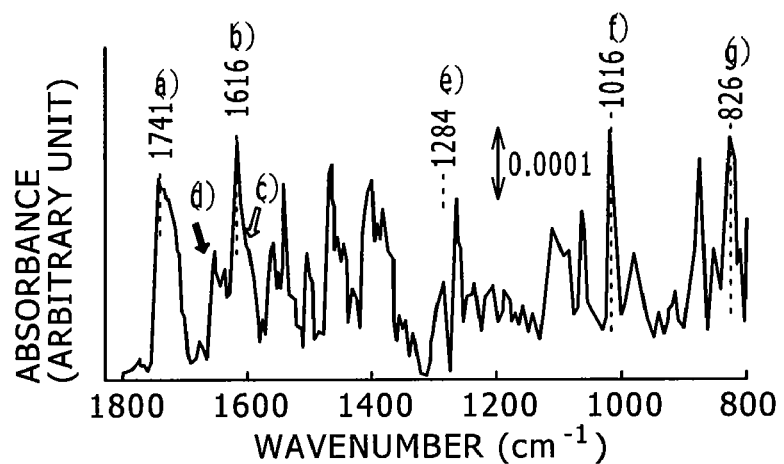
FIGS. 16 A to 16C are a graph showing how the IRA spectrum of the cast film varies in the medium wavenumber region depending on the concentration of the solution used to form the cast film according to the first example.
Figure 16B:
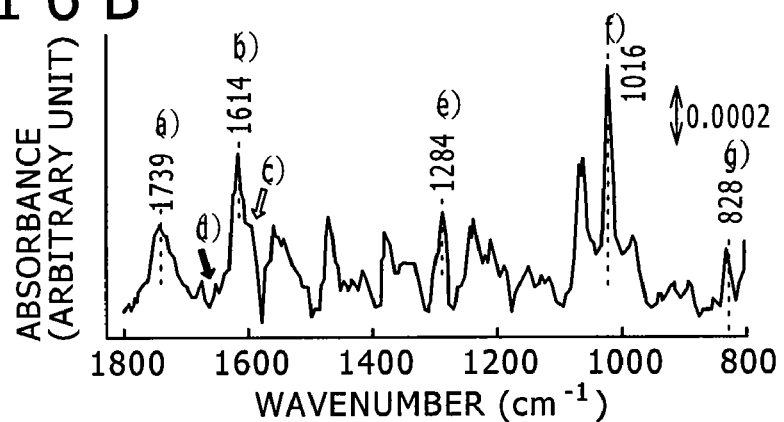
Figure 16C:
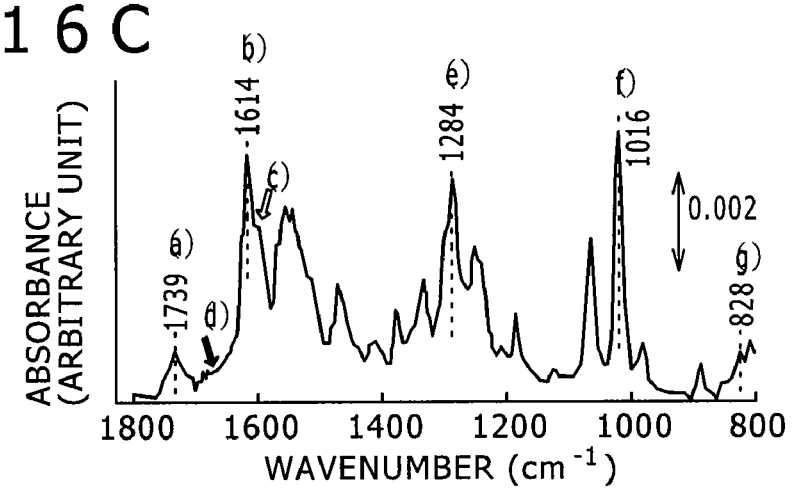
Figure 17:
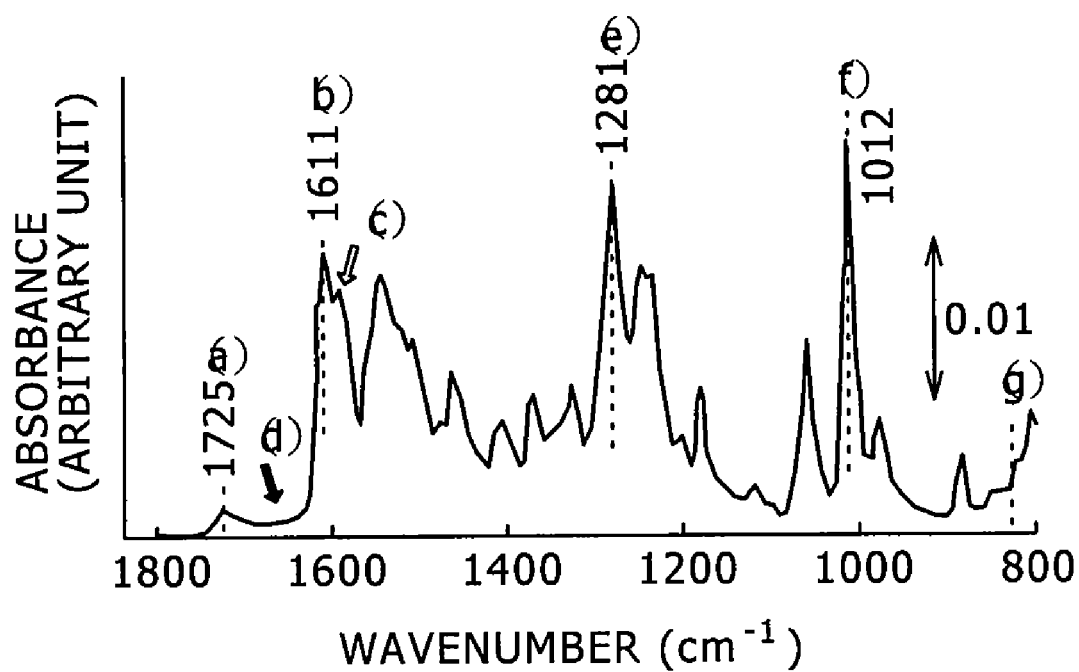
FIG. 17 is an infrared transmission absorption spectrum (in the medium frequency region) of the π-electron conjugated molecule 7 in bulk form according to the first example.

FIGS. 16A, 16B, and 16C show how the cast film varies in IRA spectrum (in the medium frequency region) depending on the concentration the solution from which it is formed (at 250 µmol/L, 1 mmol/L, and 4 mmol/L). FIG. 17 is an infrared transmission absorption spectrum (in the medium frequency region) of the π-electron conjugated molecule 7 in bulk form.

It is noted that the band (a) due to the C=O bond of the lactam ring A shifts toward the high-frequency side as the film thickness decreases. This probably suggests an increase in the degree of freedom of lactam. It is also noted that the intramolecular association band (b) due to the aromatic ketone shifts toward the high-frequency side more than that of the molecule in bulk as the film thickness decreases, while the intramolecular association band (c) shifts toward the low-frequency side as the film thickness decreases. This suggests that the molecular association of the π-electron conjugated molecule 7 decreases as the film thickness decreases. The area ratio of the absorption intensity of band (a) and band (b) is 1:6 in the case of bulk material, whereas it is 1:3 in the case of the cast film formed from the solution of 4 mmol/L, 1:1 in the case of the cast film formed from the solution of 1 mmol/L, and 1:0.5 in the case of the cast film formed from the solution of 250 µmol/L. In other words, the intensity due to the C=O bond of the lactam ring increases as the film thickness decreases. This suggests a strong possibility that the surface of the disc of the skeleton takes on the face-on position parallel to the substrate. It is considered that the oxygen atom of the C=O bond points in the opposite direction of the electrode surface in view of the fact that the degree of freedom of the C=O bond increases as the film thickness decreases, as mentioned above.

The band (e) and the band (f) due to the C—C bond and C—N bond respectively of the pyrrole ring of the thin film shift toward the high-frequency side as compared with those of the bulk material. This suggests an energy increase and consequent distortion of the pyrrole ring. The oop band (g) due to the C—H bond of the pyrrole ring does not appear in the case of bulk material, and it becomes more intense as the film thickness decreases. These results indicate that the π-electron conjugated molecule 7 has its disc surface in the face-on position on the surface of the substrate. It is inferred that distortion occurs in the pyrrole ring structure in view of the fact that the phenyl ring of the π-electron conjugated molecule 7 is perpendicular to the disc surface and hence steric hindrance should be involved for the face-on arrangement.

The following discussion is focused on the hydroxyl group (—OH) connecting to the carbon atom at the position 15 and the amino group (—NH) formed by the nitrogen atom at the position 21.

Figure 18A:
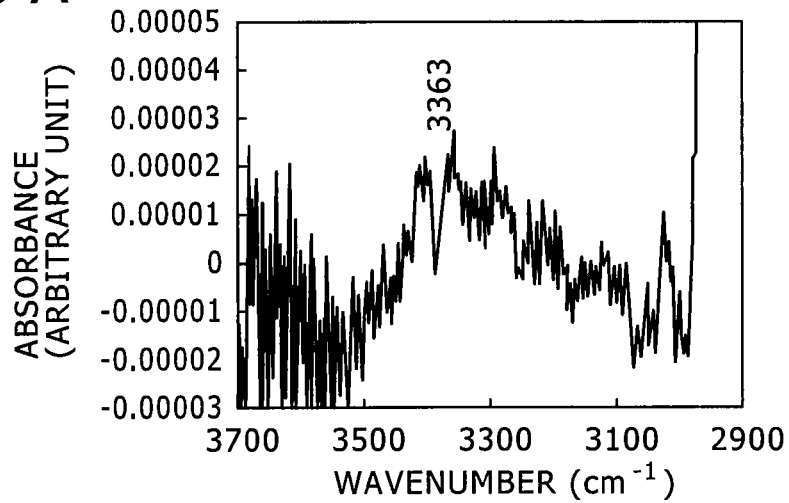
FIGS. 18A to 18C are a graph showing how the IRA spectrum of the cast film varies in the highest wavenumber region varies depending on the concentration of the solution used to form the cast film according to the first example.
Figure 18B:
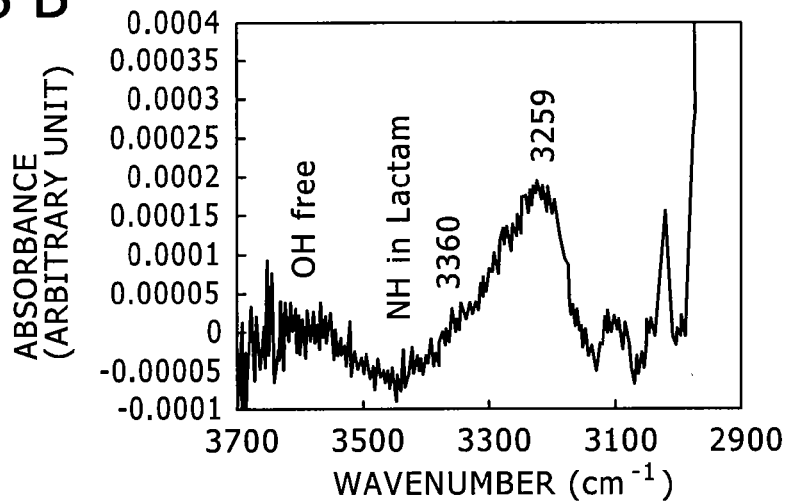
Figure 18C:
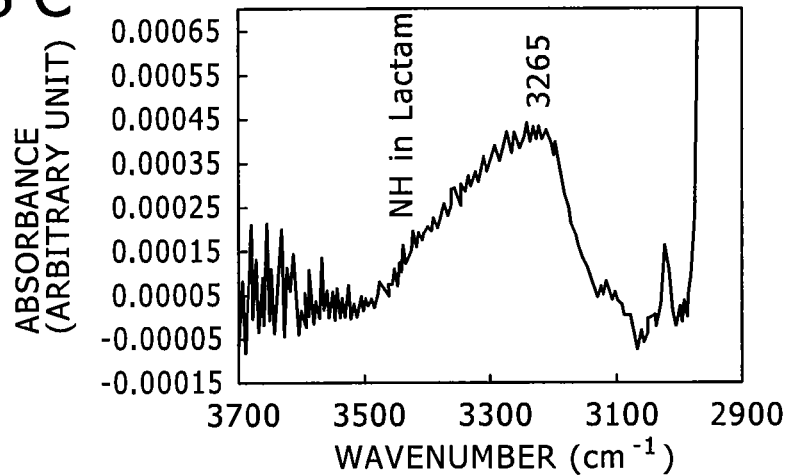
Figure 19:
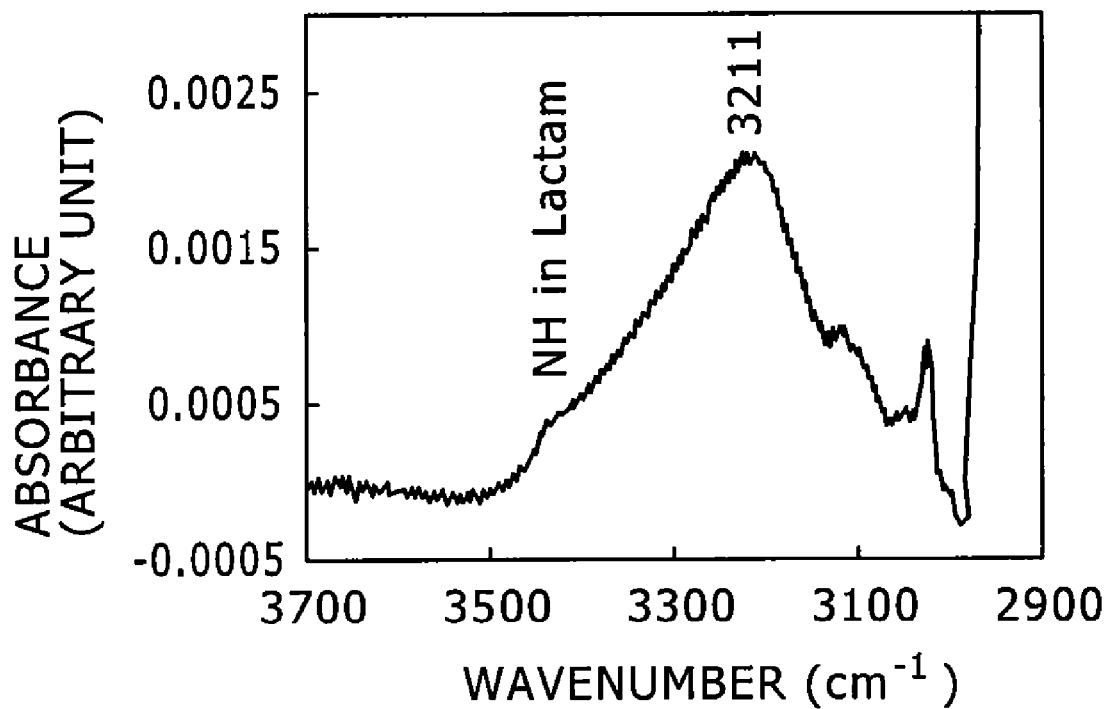
FIG. 19 is an infrared transmission adsorption spectrum (in the highest wavenumber region) of the π-electron conjugated molecule 7 in bulk form according to the first example.

FIGS. 18A, 18B, and 18C are diagrams showing how the cast film changes in IRA spectrum (in the highest frequency region) depending on the concentration of the solution from which the cast film is formed, with the concentration being at 250 µmol/L, 1 mmol/L, and 4 mmol/L. FIG. 19 is an infrared transmission absorption spectrum of the π-electron conjugated molecule 7 (in bulk form) in the highest wavenumber region.

There are both the N—H and O—H stretching vibration bands of the lactam ring in the transmission spectrum for the bulk material. There is the N—H stretching vibration band, which is as intense as that in the spectrum for the bulk material, in the spectrum of the cast film formed from the 4 mmol/L solution. This suggests that the lactam ring A orients in various directions. Moreover, the fact that the O—H stretching vibration band shifts toward the high frequency side suggests a decrease in intramolecular association. In the case of the cast film formed from the 1 mmol/L solution, the N—H stretching vibration band is weaker than that in the spectrum of the bulk material, and this suggests the possibility that the lactam ring A orients in a specific direction. The association of OH groups decreases and free OH groups begin to occur. In the case of the cast film formed from the 250 µmol/L solution, the association and dissociation of OH groups progress but it is difficult to discriminate between them in terms of intensity. The foregoing suggests that the plane of the lactam ring A is perpendicular to the gold electrode as the substrate and the OH group is on the substrate.

It is known that the edge-on orientation with respect to the substrate usually takes place in the case of structure like discotic liquid crystal, which consists of the discoid central part and the alkyl group side chain. However, it has been reported that the face-on orientation uniquely occurs on the gold substrate as in this example. (See L. Scudiero et al., J. Phys. Chem. B, 104, 11899 (2000), L. Scrudiero et al., J. Phys. Chem. B, 106, 996 (2002).)

It was found that the molecular orientation on the gold surface takes place such that the alkyl chain of the π-electron conjugated molecule 7 adsorbs (flat-on) taking on the all-trans configuration and the central part has its discoid surface absorbing (face-on), with the C=O and OH groups of the lactam ring orienting in the direction opposite to the substrate.

The above-mentioned analysis indicates that there is no electron exchange between the electrode and the nearly discoid organic molecule without alkyl side chain. (It has been reported that exchange of electrons between the discoid molecule and the electrode manifests itself as a large shift in the infrared absorption band. (See J. O. Alben, S. S. Choi, A. D. Adler and W. S. Caughey, Annals. N. Y. Acad. Sci., vol. 206, 278 (1973).)

Gold from which the electrode was made in this example may be replaced by silver or copper if adsorptivity of alkyl chain is taken into adequate consideration.

Second Example

This example demonstrates the on-off characteristics of the insulated gate field effect transistor 20 (shown in FIG. 3) in which the π-electron conjugated molecule is any of those designated as 7 to 9 in FIGS. 20A to 20D. For comparison, the same procedure as above was repeated except that the π-electron conjugated molecule was replaced by 4-pentyl-4'-cyano-biphenyl (5CB for short hereinafter). The gap between the source electrode 14 and the drain electrode 15 is about 250 nm (which is equivalent to 200 to 300 molecular layers constituting the array structure 4). It is considered that any of the π-electron conjugated molecules 7 to 9 in the first molecular layer in contact with the electrodes (at both ends of the array structure 4) orients in the same way as the π-electron conjugated molecule 7 in the first molecular layer in the first example. It is also considered that the skeleton of any of the π-electron conjugated molecules 7 to 9 in the intermediate molecular layers (excluding those at both ends) orient in the same way as the skeleton 2 of the π-electron conjugated molecule 7 in the second and subsequent molecular layers in the first example. Since the π-electron conjugated molecules 7 to 9 take on configuration similar to discotic liquid crystal, the influence of orientation of the skeleton 2 at both ends spreads over hundreds of molecular layers on account of the π-π stacking effect.

Figure 20A:
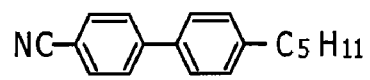
FIGS. 20A to 20D show the structural formulas of the molecules used to make the insulated gate field effect transistor in a second example and comparative example.
Figure 20B:
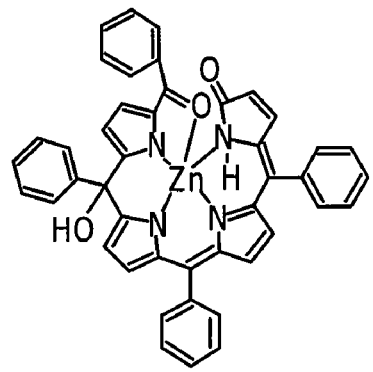
Figure 20C:
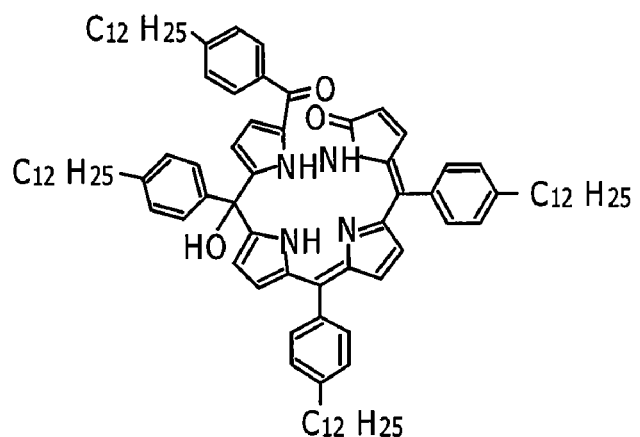
Figure 20D:
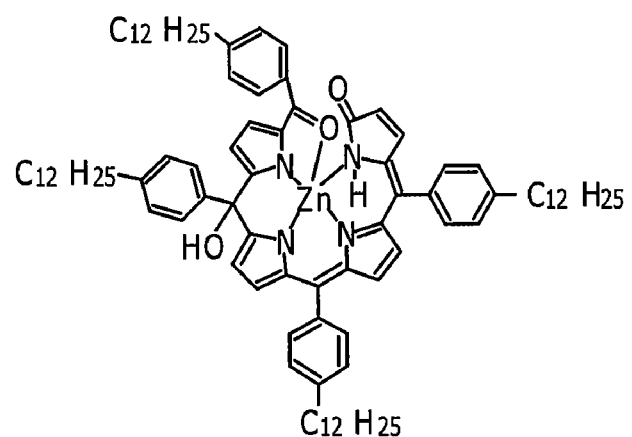

FIG. 20A shows the structural formulas of 5CB, FIG. 20B shows the structural formulas of the π-electron conjugated molecules 9, FIG. 20C shows the structural formulas of the π-electron conjugated molecules 8 and FIG. 20D shows the structural formulas of the π-electron conjugated molecules 7. The π-electron conjugated molecule 7 is a zinc complex of biladienone derivative, which was used in the first example. The π-electron conjugated molecule 8 is the same biladienone derivative as the π-electron conjugated molecule 7 except that it has no zinc ion. The π-electron conjugated molecule 9 is a complex with a zinc ion in which the side chain 3 is a phenyl group without any flexible alkyl chain.

Figure 21A:
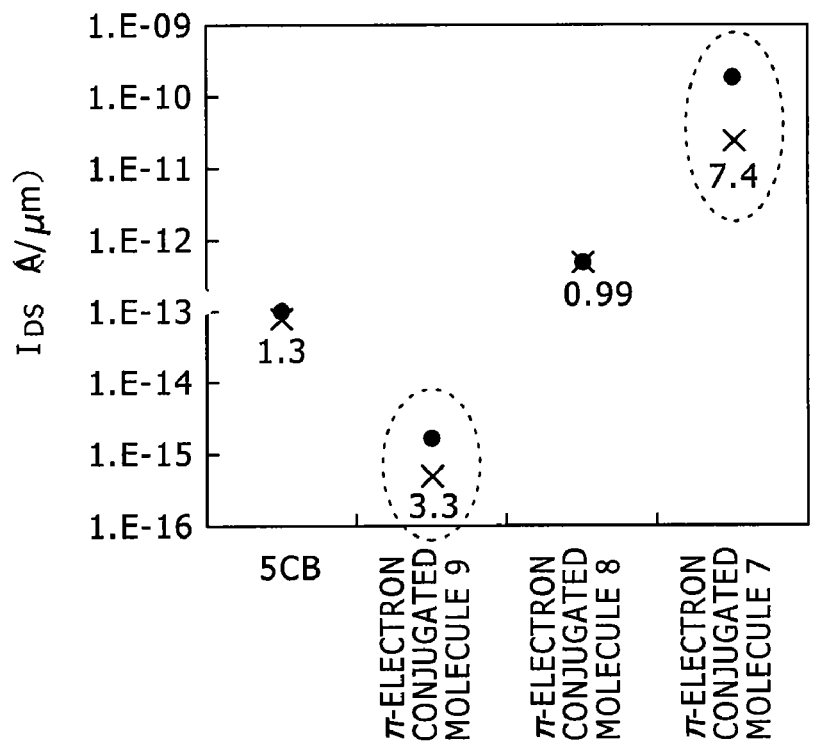
FIGS. 21A and 21B are a diagram showing the characteristic properties of the source-drain current of the insulated gate field effect transistor in the second example and comparative example.
Figure 21B:
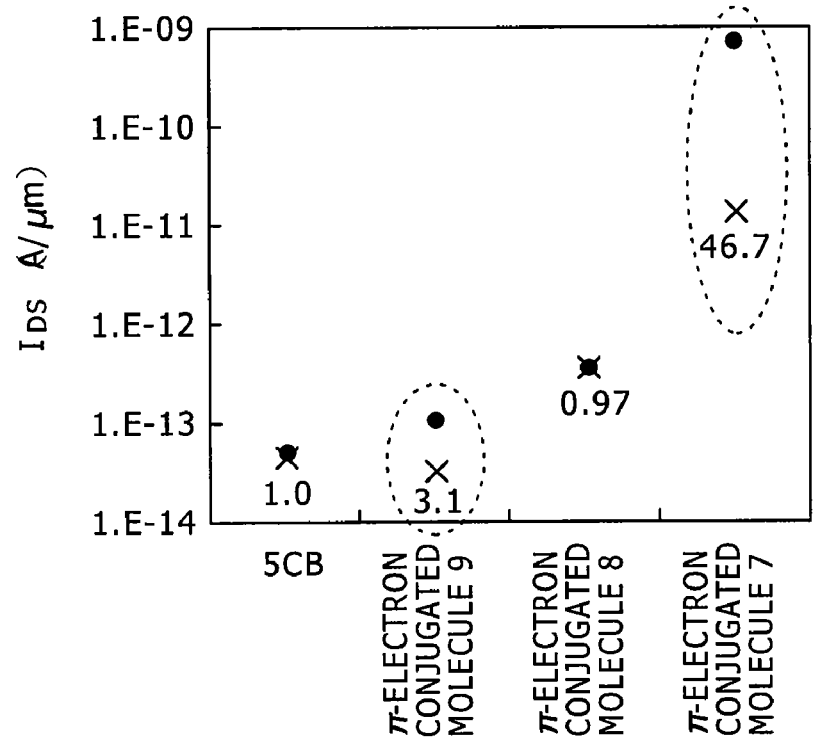

FIGS. 21A and 21B are a diagram showing the change in source-drain current IDS that is observed when the insulated gate field effect transistor 20 is turned on and off by applying a gate voltage to the gate electrode 13. FIG. 21A represents the data for a frequency of 0.01 Hz, and FIG. 21B represents the data for a frequency of 0.1 Hz. Black points denote the IDS measured without gate voltage and cross marks denote the $I_{DS}$ measured with gate voltage.

It is noted from FIGS. 21A and 21B that the insulated gate field effect transistor according to the second example of the present invention operates such that the source-drain current IDS increases to the maximum when no gate voltage is applied but decreases when gate electrode is applied.

The effect of zinc ion is known from the results attained by the π-electron conjugated molecules 7 and 8. In the presence of zinc ion, a large source-drain current $I_{DS}$ occurs when no gate electrode is applied. This suggests that the functional molecular element 10 is highly capable of flowing current. Moreover, the source-drain current $I_{DS}$ greatly changes when the gate voltage is turned on and off. This suggests a good switching capability. By contrast, without zinc ions, the functional molecular element 10 is poor in ability to flow current and has no switching function regardless of gate voltage turned on and off.

The effect of alkyl chains in the side chains 3 is known from the results attained by the π-electron conjugated molecules 7 and 9. In the presence of alkyl chains, the functional molecular element 10 is highly capable of flowing current and excels in switching performance in the same way as mentioned above. By contrast, without alkyl chains, the functional molecular element 10 is poor in ability to flow current, with the source-drain current $I_{DS}$ changing little when gate voltage is turned on and off.

The foregoing embodiments and examples of the present invention have demonstrated the functional molecular element and functional molecular device which have a decreased contact resistance between the electrode and the π-electron conjugated molecule because the (nearly) discoid π-electron conjugated molecule (which takes on the columnar array structure) has its alky side chains adsorbing to the electrode surface.

There has been described above a new functional molecular element characterized by a reduced contact resistance between the electrode and the constituent molecules, a method for production thereof, and a functional molecular device. They will be find use in the field of electronic devices, such as switch, transistor, memory, and logic circuit. The material and principle disclosed herein will be used to produce any components ranging from macrosize to nanosize.

While the invention has been described in its preferred embodiments and examples, it is to be understood that they are not intended to restrict the scope of the invention but obviously modifications and variations are possible within the scope of the invention.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention claimed is

1. A functional molecular element which comprises electrodes and π-electron conjugated molecules held between said electrodes, wherein each of said π-electron conjugated molecules has a substantially planar skeleton and side chains connecting to said planar skeleton and also forms an adsorbing molecule, with said planar skeleton oriented substantially parallel to said electrodes, as said side chains adsorb to said electrodes, such that a structure including said electrodes and at least said adsorbing molecules allows current to flow in the direction perpendicular to said planar skeleton, wherein said π-electron conjugated molecule is any of tetrapyrrole derivatives, phthalocyanine derivative, and aromatic condensed polycyclic compounds having three or more rings;

wherein said π-electron conjugated molecule or different species thereof is any of porphyrin derivatives, linear tetrapyrrole derivatives, and coronene derivatives;

wherein said π-electron conjugated molecule includes a biladienone derivative represented by the general formula below:

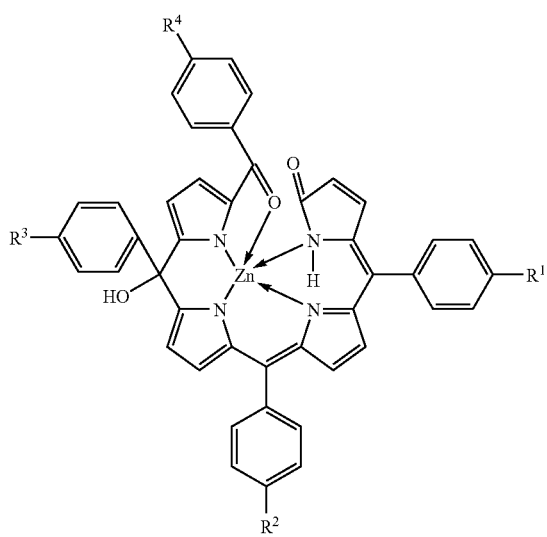

wherein $R^1$, $R^2$, $R^3$, and $R^4$ independently denote identical or different $C_3$-$C_{12}$ alkyl groups.

2. The functional molecular element according to claim 1, wherein said structure is an array structure consisting of π-electron conjugated molecules of the same species as said adsorbing molecule and/or π-electron conjugated molecules of different species from said adsorbing molecule, which pile up in one direction with respect to said planar skeleton of said adsorbing molecule by intramolecular π-π stacking in said planar skeleton, said array structure being capable of flowing current in a piling direction thereof.

3. The functional molecular element according to claim 2, wherein a columnar array structure is formed by intramolecular π-π stacking between opposing electrodes from said adsorbing molecule and π-electron conjugated molecules of the same species as said adsorbing molecule and/or π-electron conjugated molecules of different species from said adsorbing molecule, said adsorbing molecule existing on either of said opposing electrodes.

4. The functional molecular element according to claim 2, wherein said π-electron conjugated molecule of different species is any of tetrapyrrole derivatives, phthalocyanine derivatives, and aromatic condensed polycyclic compounds having three or more rings.

5. The functional molecular element according to claim 1, wherein said π-electron conjugated molecule is constructed of said planar skeleton and π-electron conjugated skeletons of the same species as said planar skeleton and/or π-electron conjugated skeletons of different species from said planar skeleton which are connected to each other by a linkage chain, said structure is an array structure which has the adsorbing molecule arranged substantially parallel to said electrodes through adsorption by said side chain and which consists of π-electron conjugated skeleton of the same species as said adsorbing molecule and/or π-electron conjugated skeleton of different species from said adsorbing molecule, which pile up in one direction with respect to said adsorbing molecule, said array structure being capable of flowing current in its piling direction.

6. The functional molecular element according to claim 5, wherein a columnar array structure is formed between opposing electrodes by piling from said adsorbing molecule and π-electron conjugated skeletons of the same species as said adsorbing molecule and/or π-electron conjugated skeletons of different species from said adsorbing molecule, said adsorbing skeleton existing on either of said opposing electrodes.

7. The functional molecular element according to claim 1, wherein said current is controlled by action of a gate electric field.

8. The functional molecular element according to claim 1, wherein said side chain of said π-electron conjugated molecule has a flexible structure.

9. The functional molecular element according to claim 1, wherein said porphyrin derivatives and linear tetrapyrrole derivatives are a complex having a center metal.

10. The functional molecular element according to claim 1, wherein said side chain is any of alkyl group, alkoxyl group, and silanyl group, or an aromatic ring having any of alkyl group, alkoxyl group, and silanyl group.

11. A functional molecular device which comprises an array structure constructed of a functional molecular element claim 1 and opposing electrodes as said electrodes holding said array structure therebetween, each of said π-electron conjugated molecules has a substantially planar skeleton and side chains connecting to said planar skeleton and also forms an adsorbing molecule, with said planar skeleton oriented substantially parallel to said electrodes, as said side chains adsorb to said electrodes, such that the structure consisting of said electrodes and at least said adsorbing molecules allows current to flow in the direction perpendicular to said planar skeleton.

12. The functional molecular device as defined in claim 11, wherein said array structure is electrically connected to said opposing electrodes.

13. The functional molecular device as defined in claim 12, which comprises a control electrode to control said current by application of electric field to said array structure, said control electrode extending in the same direction as constituents of the array structure pile up.

14. The functional molecular device as defined in claim 12, which is an insulated gate field effect transistor having a gate insulating layer formed on said control electrode, a source electrode and a drain electrode, as said opposing electrodes, formed on said gate insulating layer, and at least said array structure arranged between the source electrode and the drain electrode.

\* \* \* \* \*